(12) United States Patent
Li et al.

(10) Patent No.: US 10,930,814 B1
(45) Date of Patent: Feb. 23, 2021

(54) METHOD OF MANUFACTURING MULTI-COLOR LIGHT EMITTING PIXEL UNIT

(71) Applicant: Hong Kong Beida Jade Bird Display Limited, Hong Kong (CN)

(72) Inventors: Qiming Li, Albuquerque, NM (US); Qunchao Xu, Shanghai (CN)

(73) Assignee: Jade Bird Display (Shanghai) Limited, Shanghai (CN)

( * ) Notice: Subject to any disclaimer, the term of this patent is extended or adjusted under 35 U.S.C. 154(b) by 0 days.

(21) Appl. No.: 16/567,028

(22) Filed: Sep. 11, 2019

(51) Int. Cl.
*H01L 33/08* (2010.01)
*H01L 33/38* (2010.01)
*H01L 25/075* (2006.01)
*H01L 33/62* (2010.01)

(52) U.S. Cl.
CPC .......... *H01L 33/08* (2013.01); *H01L 25/0753* (2013.01); *H01L 33/387* (2013.01); *H01L 33/62* (2013.01); *H01L 2933/0016* (2013.01)

(58) Field of Classification Search
CPC ... H01L 33/08; H01L 25/0753; H01L 33/387; H01L 33/62; H01L 2933/0016; H01L 33/06; H01L 27/153; H01L 31/167; H01L 33/007; H01L 33/38; H01L 33/0075; H01L 27/156; H01L 33/50; H01L 33/32; H01L 31/02019; H01L 31/02327; H05B 45/20; H05B 47/19; H04B 10/116; H04B 10/572
See application file for complete search history.

(56) References Cited

U.S. PATENT DOCUMENTS

| | | | |
|---|---|---|---|
| 2015/0028356 A1* | 1/2015 | Lee | H01L 27/15 257/79 |
| 2017/0025567 A1* | 1/2017 | Lu | H01L 27/153 |
| 2019/0198709 A1* | 6/2019 | Wildeson | H04B 10/116 |

\* cited by examiner

*Primary Examiner* — Mohammed R Alam
(74) *Attorney, Agent, or Firm* — Finnegan, Henderson, Farabow, Garrett & Dunner, LLP

(57) ABSTRACT

A method for fabricating a multi-color light emitting pixel unit, includes: forming a stack structure on a substrate, the stack structure comprising a first metal layer, a first type of light emitting layer, a second metal layer, and a second type of light emitting layer in an order from bottom to top; patterning the second type of light emitting layer and the second metal layer until a portion of the first type of light emitting layer is exposed; and selectively etching the stack structure to form a first light emitting transistor and a second light emitting transistor, the first light emitting transistor including the first metal layer and the first type of light emitting layer, and the second light emitting transistor including the first metal layer, the first type of light emitting layer, the second metal layer, and the second type of light emitting layer.

20 Claims, 23 Drawing Sheets

Stacking a first type of light emitting layer, a second type of light emitting layer, and a third type of emitting layer on a substrate from bottom to top, forming a first metal layer at the bottom of the first type of light emitting layer, forming a second metal layer 2 at the bottom of the second type of light emitting layer, and forming a third metal layer at the bottom of the third type of light emitting layer — S701

Patterning the third type of light emitting layer and the third metal layer until the top of the second type of light emitting layer is exposed, thereby forming a step structure by the third type of light emitting layer on the second type of light emitting layer — S702

Further etching and patterning the second type of light emitting layer and the second metal layer until the top of the first type of light emitting layer is exposed, thereby forming a step structure by the second type of light emitting layer on the first type of light emitting layer — S703

According to a pre-set first type of light emitting region, a pre-set second type of light emitting region, and a pre-set third type of light emitting region, etching the third type of light emitting layer, the third metal layer, the second type of light emitting layer, the second metal layer, the first type of light emitting layer and the first metal layer — S704

Forming an extraction electrode of the second metal layer and an extraction electrode of the third metal layer, and forming a shared top electrode layer on the tops of the first type of light emitting layer, the second type of light emitting layer, and the third type of light emitting layer — S705

FIG. 29

METHOD OF MANUFACTURING MULTI-COLOR LIGHT EMITTING PIXEL UNIT

FIELD OF THE INVENTION

The present disclosure generally relates to semiconductor manufacturing technology field and, more particularly, to a method of manufacturing a multi-color light emitting pixel unit.

BACKGROUND OF THE INVENTION

With the requirement for miniaturization and portability of electronic devices, it is increasingly important for a light emitting device to integrate a plurality of various types of light emitting transistors and multi-color light emitting pixel units. A conventional process of fabricating a multi-color display chip includes forming a first type of light emitting region and then forming another type of light emitting region. The conventional process of fabricating the different types of light emitting regions becomes increasingly difficult, due to the complexity of aligning processes and transferring processes, etc., thereby leading to problems such as decreased alignment accuracy, decreased yield, and increased cost, etc.

In addition, the conventional process of fabricating various light emitting regions usually includes: bonding a base having an epitaxial layer to a substrate, and then peeling off the base, which causes stress in the epitaxial layer, which may result in warpage and deformation of the epitaxial layer. In addition, the current light emitting display chip integrating different types of light emitting regions further has problems such as high power consumption and heat dissipation.

BRIEF SUMMARY OF THE DISCLOSURE

According to one aspect of the present disclosure, a method for fabricating a multi-color light emitting pixel unit is provided. The method includes: forming a stack structure on a substrate, the stack structure comprising a first metal layer, a first type of light emitting layer, a second metal layer, and a second type of light emitting layer in an order from bottom to top; patterning the second type of light emitting layer and the second metal layer until a portion of the first type of light emitting layer is exposed; and selectively etching the stack structure to form a first light emitting transistor and a second light emitting transistor, the first light emitting transistor including the first metal layer and the first type of light emitting layer, and the second light emitting transistor including the first metal layer, the first type of light emitting layer, the second metal layer, and the second type of light emitting layer.

BRIEF DESCRIPTION OF THE DRAWINGS

FIG. 29 is a flow chart illustrating a method of fabricating the multi-color light emitting pixel unit illustrated in FIG. 3, according to an embodiment of the present disclosure.

DETAILED DESCRIPTION OF THE EMBODIMENTS

Reference will now be made in detail to the present preferred embodiments to provide a further understanding of the disclosure. The specific embodiments and the accompanying drawings discussed are merely illustrative of specific ways to make and use the disclosure, and do not limit the scope of the disclosure or the appended claims.

Hereinafter combined with FIGS. 1 to 40, the present disclosure is further described by the embodiments of the disclosure. It should be pointed out that all appended drawings adopt a very simplified form and imprecise scaling is merely used to assistant explain the embodiments of the disclosure conveniently and clearly.

A multi-color light emitting pixel unit disclosed herein at least includes one type of light emitting transistor, or several types of light emitting transistors. Each type of light emitting transistor includes an upper conductive layer, a bottom conductive layer, and a light emitting layer between the upper conductive layer and the bottom conductive layer. All of the light emitting transistors share the same upper conductive layer and the same bottom conductive layer. It should be noted that, the light emitting layer can be a single layer or multiple layers. A middle layer can be arranged between two of multiple light emitting layers in a same light emitting diode. It is assumed that a multi-color light emitting pixel unit includes first to Mth types of light emitting transistors, where M is an integer and not less than two. Each one of the first to Mth types of light emitting transistors at least includes a same type of light emitting layer. For example, each one of the first to Mth types of light emitting transistors includes a first type of light emitting layer. Any one of the second type to Mth type of light emitting layers is different from the first type of light emitting layer. A micro display panel including a plurality of the pixel units mentioned above arranged in a matrix is also provided in the present disclosure.

In some embodiments, the light emitting transistor can be at least one of a light emitting diode (LED), a Schottky light emitting transistor, and etc. The top conductive layer of the light emitting transistor is, but not limited to, a transparent conductive layer, and the bottom conductive layer of the light emitting transistor is, but not limited to, a metal layer. Hereinafter, the LED is used as an example of the light emitting transistor, but this does not limit the scope of the present disclosure. A person skilled in the art can change the LED to another light emitting transistor according to conventional technical means.

Figure 1:
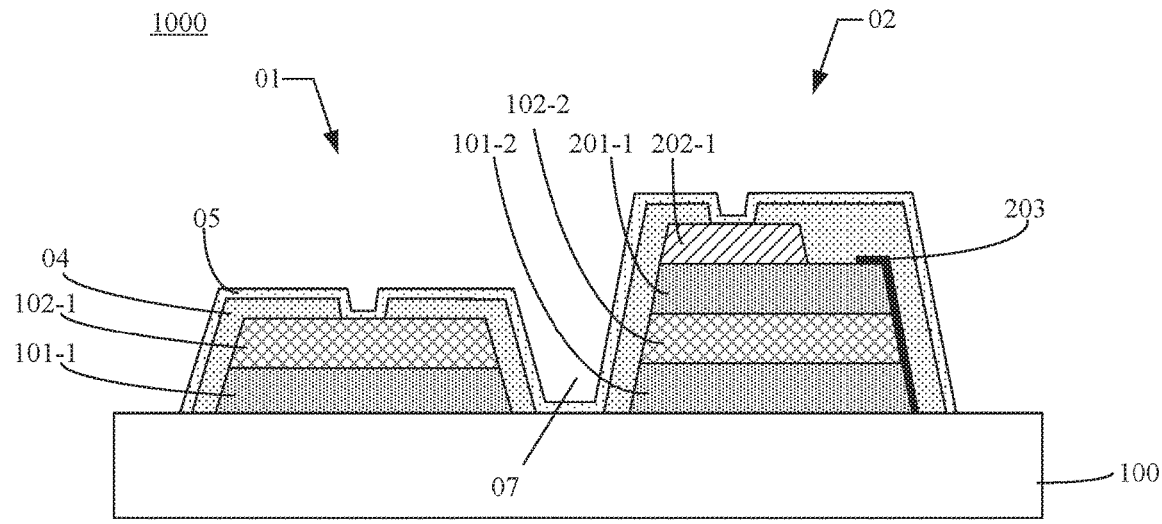
FIG. 1 is a cross-sectional view illustrating a multi-color light emitting pixel unit according to an embodiment of the present disclosure.

FIG. 1 is a cross-sectional view illustrating a multi-color light emitting pixel unit 1000, according to an embodiment of the present disclosure. Referring to FIG. 1, the multi-color light emitting pixel unit 1000 includes, at least, a first type of LED 01 and a second type of LED 02 arranged side by side on a substrate 100. The top of the first type of LED 01 and the top of the second type of LED 02 are not at a same horizontal plane. The type of the first type of LED 01 is different from that of the second type of LED 02. Herein, as shown in FIG. 1, the top of the first type of LED 01 is lower than that of the second type of LED 02. According to an embodiment, the first type of LED 01 is selected from one of a red LED, a green LED, a blue LED, a yellow LED, an orange LED, or a cyan LED, and the second type of LED 02 is selected from one of a green LED, a blue LED, a red LED, a yellow LED, an orange LED, or a cyan LED. Additionally, the size of a light emitting area of the first type of LED 01 is different from that of the second type of LED 02. For example, the first type of LED 01 is a red LED, the second type of LED 02 is a green LED, and the size of the light emitting area of the red LED is different from that of the green LED. Furthermore, according to different color that may be needed, the light emitting area of the green LED can be smaller than that of the red LED.

In addition, an isolation structure 07 is arranged between the first type of LED and the second type of LED. In the embodiment illustrated in FIG. 1, the isolation structure 07 between the first type of LED 01 and the second type of LED 02 is an isolation trench. The multi-color light emitting pixel unit 1000 includes a first metal layer, a first type of light emitting layer, a second metal layer, and a second type of light emitting layer. As illustrated in FIG. 1, the first type of LED 01 includes, at least, a first segment of a first metal layer 101-1 and a first segment of a first type of light emitting layer 102-1 in an order from bottom to top. The first segment of the first metal layer 101-1 constitutes a bottom conductive layer of the first type of LED 01. The second type of LED 02 includes, at least, a second segment of the first metal layer 101-2, a second segment of the first type of light emitting layer 102-2, a first segment of a second metal layer 201-1, and a first segment of a second type of light emitting layer 202-2 in an order from bottom to top, and a first electrical connector 203. The first segment of the first metal layer 101-1 and the second segment of the first metal layer 101-2 are electrically connected with the substrate 100. The isolation structure 07 isolates the first segment of the first metal layer 101 1 in the first type of LED 01 from the second segment of the first metal layer 101-2 in the second type of LED 02. The isolation structure 07 also isolates the first segment of the first type of light emitting layer 102-1 in the first type of LED 01 from the second segment of the first type of light emitting layer 102-2 in the second type of LED 02. Additionally, in order to simplify the manufacturing process, the first segment of the second metal layer 201-1, the second segment of the first type of light emitting layer 102-2, and the second segment of the first metal layer 101-2 in the second type of LED 02 are electrically connected with each other by the first electrical connector 203. According to one embodiment, the first electrical connector 203 can be attached to and contact part or all of the side wall surface of the second type of LED 02. Alternatively, the first electrical connector 203 can be attached to and contact only the surface of the first segment of the second metal layer 201-1 and the second segment of the first metal layer 101-2 in the second type of LED 02. Still alternatively, the first electrical connector 203 can be formed as a conductive side arm attached to and contacting the sidewalls of the first segment of the second metal layer 201-1, the second segment of the first type of light emitting layer 102-2, and the second segment of the first metal layer 101-2. The electrical connector 203 between the second segment of the first metal layer 101-2 and the first segment of the second metal layer 201-1 in the second type of LED 02 can have another shape, such as a curved line. In the embodiment illustrated in FIG. 1, the first electrical connector 203 is attached to the sidewall of the second type of LED 02, so that the first electrical connector 203 conforms to the surface topography of the side wall of the second type of LED 02.

Referring to FIG. 1, a top isolation layer 04 and a top transparent conductive layer 05 are arranged on the first segment of the first type of light emitting layer 102-1 in the first type of LED 01 and the first segment of the second type of light emitting layer 202-1 in the second type of LED 02. The top isolation layer 04 covers the first segment of the first type of light emitting layer 102 1, the first segment of the second type of light emitting layer 202 1, and the exposed substrate 100. The top isolation layer 04 has openings exposing portions of the top surfaces of the first segment of the first type of light emitting layer 102-1 and the first segment of the second type of light emitting layer 202 1. The top transparent conductive layer 05 covers the top isolation layer 04 and is formed in the openings of the top isolation layer 04, and thereby contacts the exposed top surfaces of the first segment of the first type of light emitting layer 102 1 and the first segment of the second type of light emitting layer 202-1 via the openings.

The substrate 100 is an integrated circuit (IC) substrate. The IC substrate includes an interconnection layer, which is electrically connected with the first segment of the first metal layer 101-1 in the first type of LED 01 and the second segment of the first metal layer 101 2 in the second type of LED 02. Since the first electrical connector 203 is connected with the second segment of the first metal layer 101-2 in the second type of LED 02, the first electrical connector 203 is connected with the interconnection layer in the substrate 100. In addition, referring to FIG. 1, the bottom of the first electrical connector 203 extends to the substrate 100 to connect with the interconnection layer. Herein, the IC substrate at least includes a drive circuit. The drive circuit controls every LED separately.

Figure 2:
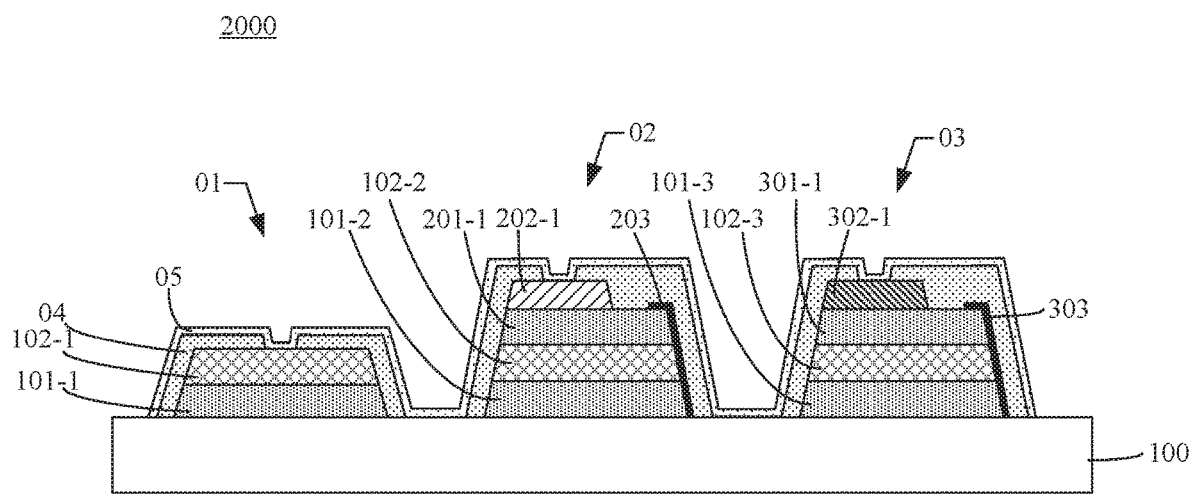
FIG. 2 is a cross-sectional view illustrating a multi-color light emitting pixel unit according to an embodiment of the present disclosure.

FIG. 2 is a cross-sectional view illustrating a multi-color light emitting pixel unit 2000, according to an embodiment of the present disclosure. Referring to FIG. 2, the multi-color light emitting pixel unit 2000 includes, at least, the first type of LED 01, the second type of LED 02, and a third type of LED 03, which are arranged on a same substrate 100. The third type of LED 03 is different from the first type of LED 01 and the second type of LED 02. Herein, the first type of LED 01 is selected from one of a red LED, a green LED, a blue LED, a yellow LED, am orange LED, or a cyan LED; the second type of LED 02 is selected from one of a green LED, a blue LED, a red LED, a yellow LED, an orange LED, or a cyan LED; and the third type of LED 03 is selected from one of a blue LED, a red LED, a green LED, a yellow LED, an orange LED, or a cyan LED. For example, a red LED is selected as the first type of LED 01, a green LED is selected as the second type of LED 02, and a blue LED is selected as the third type of LED 03. Referring to FIG. 2, the height of the third type of LED 03 is different from that of the first type of LED 01. Furthermore, the height of the first type of LED 01 is different from that of the second type of LED 02, while the height of the second type of LED 02 is the same as that of the third type of LED 03. In other embodiments, the height of the third type of LED 03, the height of the first type of LED 01, and the height of the second type of LED 02 can be different from each other, as shown in FIG. 3.

In the multi-color light emitting pixel unit 2000, the structures of the first type of LED 01 and the second type of LED 02 are the same as those of the first type of LED 01 and the second type of LED 02 in the multi-color light emitting pixel unit 2000, and therefore detailed descriptions thereof are not repeated. The third type of LED 03 in the multi-color light emitting pixel unit 2000 includes, at least, a third segment of the first metal layer 101-3, a third segment of a first type of light emitting layer 102-3, a first segment of a third metal layer 301-1, and first segment of a third type of light emitting layer 302-1 in an order from bottom to top, and a second electrical connector 303 connecting the third segment of the first metal layer 101-3 and the first segment of the third metal layer 301-1. The multi-color light emitting pixel unit 2000 also includes a top isolation layer 04 covering the first type of LED 01, the second type of LED 02, and the third type of LED 03, and having opening exposing a portion of the first segment of the first type of light emitting layer 102-1 in the first type of LED 01, a portion of the first segment of the second type of light emitting layer 202-1, and a portion of the first segment of the third type of light emitting layer 302-1. A top electrode layer 05 is formed on top of the top isolation layer 04 and contacts the first segment of the first type of light emitting layer 102-1, the first segment of the second type of light emitting layer 202-1, and the first segment of the third type of light emitting layer 302-1 via the openings of the top isolation layer 04.

Figure 3:
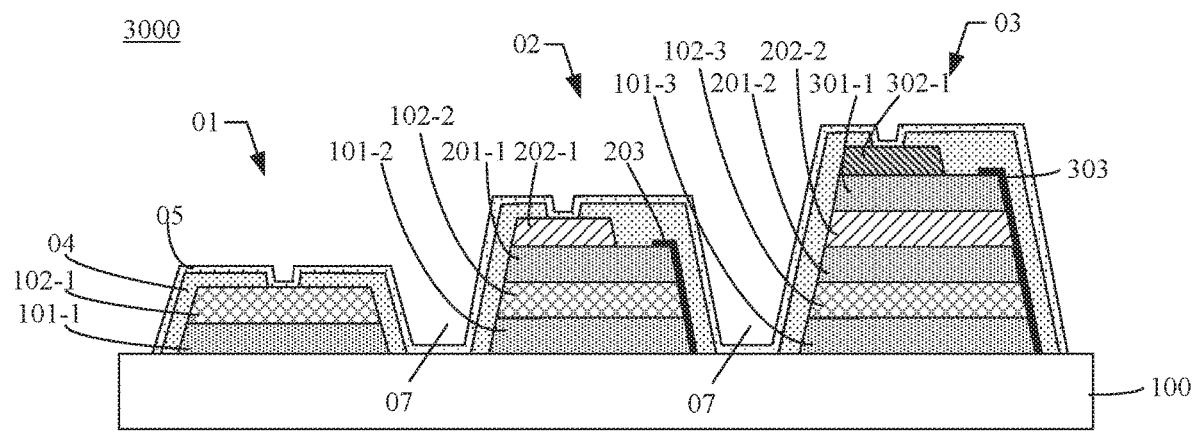
FIG. 3 is a cross-sectional view illustrating a multi-color light emitting pixel unit according to an embodiment of the present disclosure.

FIG. 3 is a cross-sectional view illustrating a multi-color light emitting pixel unit 3000, according to an embodiment of the present disclosure. Referring to FIG. 3, in the multi-color light emitting pixel unit 3000, the top of the third type of LED 03 is higher than that of the second type of LED 02, while the height of the first type of LED is different from that of the second type of LED 03.

Figure 4:
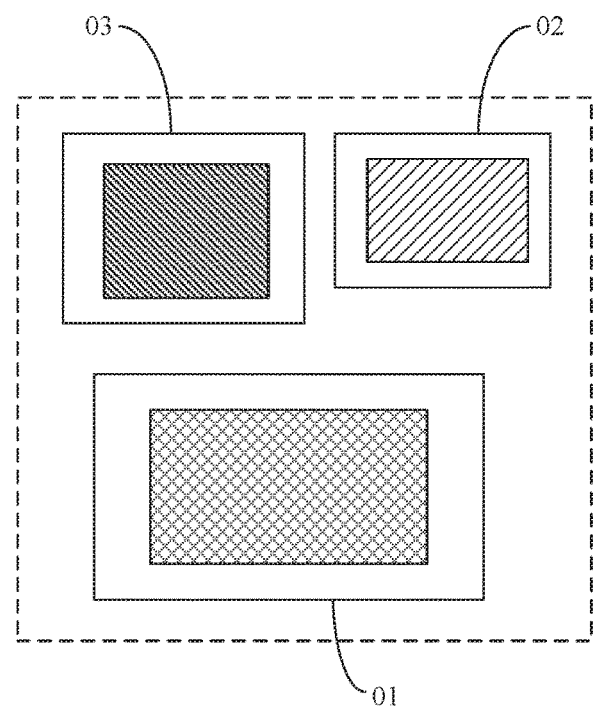
FIG. 4 is a top view illustrating a multi-color light emitting pixel unit according to an embodiment of the present disclosure.

FIG. 4 is a top view of the multi-color light emitting pixel unit 4000, according to an embodiment of the present disclosure. The multi-color light emitting pixel unit 4000 can be the multi-color light emitting pixel unit 2000 illustrated in FIG. 2 or the multi-color light emitting pixel unit 3000 illustrated in FIG. 3. FIG. 4 illustrates the arrangement of the three types of the LEDs 01, 02, and 03 in a pixel unit, but the present disclosure also includes other arrangements, such as a matrix. Herein, the size of the light emitting area of the third type of LED 03 is different from that of the first type of LED 01 and is different from that of the second type of the LED 02. For example, the first type of LED 01 is a red LED, the second type of LED 02 is a green LED, and the third type of LED 03 is blue LED. The size of the light emitting area of each one of the first, second, and third type of LEDs 01, 02, and 03 can be determined according to the required light color to be emitted by the multi-color light emitting pixel unit 4000. When white light is required, the size of the light emitting area of the red LED is larger than that of the green LED, and the size of the light emitting area of the blue LED is larger than that of the green LED. As shown in FIG. 4, the space between the red LED and the blue LED is larger than the space between the blue LED and the green LED; the space between the red LED and the green LED is larger than the space between the blue LED and the green LED, so as to achieve a better light emission effect.

Referring back to FIG. 3, an isolation structure 07 is arranged between two of the first type of LED 01, the second type of LED 02, and the third type of LED 03. The isolation structure is an isolation trench. The first type of LED 01, the second type of LED 02, and the third type of LED 03 are formed from a first metal layer 101, a first type of light emitting layer 102, a second metal layer 201, a second type of light emitting layer 202, a third metal layer 301, and a third type of light emitting layer 302. The first type of LED 01 and the second type of LED 02 in FIG. 3 are the same as the first type of LED 01 and the second type of LED 02 in FIG. 2. Specifically, as illustrated in FIG. 3, the first type of LED 01 includes, at least, a first segment of a first metal layer 101-1 and a first segment of a first type of light emitting layer 102-1 in an order from bottom to top. The second type of LED 02 includes, at least, a second segment of the first metal layer 101-2, a second segment of the first type of light emitting layer 102-2, a first segment of a second metal layer 201-1, and a first segment of a second type of light emitting layer 202-1 in an order from bottom to top, and a first electrical connector 203. The third type of LED 03 includes, at least, a third segment of the first metal layer 101-3, a third segment of the first type of light emitting layer 102-3, a second segment of the second metal layer 201-2, a second segment of the second type of light emitting layer 202-2, a first segment of a third metal layer 301-1, and a first segment of a third type of light emitting layer 302-1 in an order from bottom to top, and a second electrical connector 303. As shown in FIG. 3, the first segment of the first metal layer 101-1, the second segment of the first metal layer 101-2, and the third segment of the first metal layer 101-3 are electrically connected with the substrate 100. The first electrical connector 203 in the second type of LED 02 electrically connects the first segment of the second metal layer 201-1 with the second segment of the first metal layer 101-2. The second electrical connector 303 in the third type of LED 03 electrically connects the first segment of the third metal layer 301-1 with the second segment of the second metal layer 201-2 and the third segment of the first metal layer 101-3. The isolation structure 07 isolates the first segment of the first metal layer 101-1 in the first type of LED 01 from the second segment of the first metal layer 101-2 in the second type of LED 02 and the third segment of the first metal layer 101-3 in the third type of LED 03, isolates the first segment of the first type of light emitting layer 102-1 in the first type of LED 01 from the second segment of the first type of light emitting layer 102-2 in the second type of LED 02 and the third segment of the first type of light emitting layer 102-3 in the third type of the LED 03, isolates the first segment of the second metal layer 201-1 in the second type of LED 02 from the second segment of the second metal layer 201-2 in the third type of LED 03, and isolates the first segment of the second type of light emitting layer 202-1 in the second type of LED 02 from the second segment of the second type of light emitting layer 202-2 in the third type of LED 03. It should be noted that, the first electrical connector 203 is used to connect the second segment of the first type of light emitting layer 102-2 with the second segment of the first metal layer 101-2 in the second type of LED 02, while the second electrical connector 303 is used to connect the second segment of the second type of light emitting layer 202-2 and the third segment of the first type of light emitting layer 102-3 with the third segment of the first metal layer 101-3 in the third type of LED 03. Thus, in order to simplify the manufacturing process, in the same manner as FIG. 1, the first electrical connector 203 further connects the second segment of first type of light emitting layer 102-2 with the second segment of the first metal layer 101-2. That is, in the second type of LED 02, the first electrical connector 203 connects the first segment of the second metal layer 201-1 and the second segment of the first type of light emitting layer 102-2 with the second segment of the first metal layer 101-2. The second electrical connector 303 further connects the second segment of the second type of light emitting layer 202-2 with the third segment of the first metal layer 101-3. That is, in the third type of LED 03, the second electrical connector 303 connects the first segment of the third metal layer 301-1, the second segment of the second type of light emitting layer 202-2, and the second segment of the second metal layer 201-2 with the third segment of the first metal layer 101-3. Alternatively, the second electrical connector 303 further connects the second segment of the second type of light emitting layer 202-2 and the third segment of the first type of light emitting layer 102-3 with the third segment of the first metal layer 101-3. That is, in the third type of LED 03, the second electrical connector 303 connects the first segment of the third metal layer 301-1, the second segment of the second type of light emitting layer 202-2, the second segment of the second metal layer 201-2, and the third segment of the first type of light emitting layer 102-3 with the third segment of the first metal layer 101-3. In addition, the bottom of the first electrical connector 203 and the bottom of the second electrical connector 303 separately and directly contact the substrate 100, thereby simplifying the manufacturing process. It should be noted that the materials of the first electrical connector 203 and the second electrical connector 303 are formed of conductive metals. In an embodiment, the second electrical connector 303 is attached to and contacts the side wall surface of the third type of LED 03.

In one embodiment, the first type of light emitting layer is a red light emitting layer, the second type of light emitting layer is a green light emitting layer, and the third type of light emitting layer is a blue light emitting layer, the first type of LED 01 is a red LED 01, the second type of LED 02 is a green LED 02, and the third type of LED 03 is a blue LED 03. In the red LED 01, an electrical voltage applied between the top transparent conductive layer 05 and the first segment of the first metal layer 101-1 is applied to the first segment of the red light emitting layer 102-1. As a result, the first segment of the red light emitting layer 102-1 in the red LED 01 emits red light. In the green LED 02, the first electrical connector 203 electrically connects the second segment of the red light emitting layer 102-2 with the second segment of the first metal layer 101-2, such that an electrical voltage applied between the top transparent conductive layer 05 and the second segment of the first metal layer 101-2 is only applied to the first segment of the green light emitting layer 202-1. As a result, only the first segment of the green light emitting layer 202-1 in the green LED 02 emits green light while the second segment of the red light emitting layer 102-2 in the green LED 02 does not emit light. In the third type of LED 03, the second electrical connector 303 electrically connects the third segment of the red light emitting layer 102-3 and the second segment of the green light emitting layer 202-2 with the third segment of the first metal layer 101-3, such that an electrical voltage applied between the top transparent conductive layer 05 and the third segment of the first metal layer 101-3 is only applied to the first segment of the blue light emitting layer 302-1. As a result, only the first segment of the blue light emitting layer 302-1 in the blue LED 03 emits blue light while the third segment of the red light emitting layer 102-3 and the second segment of the green light emitting layer 202-2 in the blue LED 03 do not emit light.

Referring again to FIG. 3, a top isolation layer 04 and a top transparent conductive layer 05 are arranged on the first type of LED 01, the second type of LED 02, and the third type of LED 03. The top isolation layer 04 covers the first segment of the first type of light emitting layer 102-1, the first segment of the second type of light emitting layer 202-1, the first segment of the third type of light emitting layer 302-1, and the exposed substrate 100. Openings are arranged in the top isolation layer 04 to expose portions of the top surfaces of the first segment of the first type of light emitting layer 102-1, the first segment of the second type of light emitting layer 202-1, and the first segment of the third type of light emitting layer 302-1. The top transparent conductive layer 05 covers the top isolation layer 04 and is formed in the openings of the top isolation layer 04, thereby contacting the exposed top surface of the first segment of the first type of light emitting layer 102-1, the exposed top surface of the first segment of the second type of light emitting layer 202-1, and the exposed top surface of the first segment of the third type of light emitting layer 302-1.

The detailed description of the substrate 100 in the multi-color light emitting pixel unit 3000 with at least three types of LEDs corresponds to the description of FIG. 1 and will be not repeated herein. It should be noted that, the interconnection layer in the IC substrate 100 is electrically connected to the first type of LED 01, the second type of LED 02, and the third type of LED 03. The driver circuit in the IC substrate 100 controls every LED separately.

In the multi-color light emitting pixel units 1000 to 4000 in FIGS. 1 to 4, one or more of the emitting layers 102, 202, and 302 can have micro-gap structures. For example, in the multi-color light emitting pixel unit 1000 shown in FIG. 1, the first type of light emitting layer 102 can have micro-gap structures, or the second type of light emitting layer 202 can have micro-gap structures, or both of the first type of light emitting layer 102 and the second type of light emitting layer 202 can have micro-gap structures. As another example, in the multi-color light emitting pixel unit 3000 shown in FIG. 3, the first type of light emitting layer 102 can have micro-gap structures, or the second type of light emitting layer 202 can have micro-gap structures, or the third type of light emitting layer 302 can have micro-gap structures, or both of the first type of light emitting layer 102 and the second type of light emitting layer 202 can have micro-gap structures, or both of the second type of light emitting layer 202 and the third type of light emitting layer 302 can have micro-gap structures, or both of the first type of light emitting layer 102 and the third type of light emitting layer 302 can have micro-gap structures, or all of the first type of light emitting layer 102, the second type of light emitting layer 202 and the third type of light emitting layer 302 can have micro-gap structures. Herein, each one of the micro-gap structures in the multi-color light emitting pixel units 1000 to 3000 illustrated in FIGS. 1 to 3 can be, but are not limited to, an air gap. The air gap is sealed. Preferably, the cross-sectional dimension of the air gap is not more than 2 nm, so as to release the stress in the light emitting layer and avoid curving of the light emitting layer without impacting the light emitting efficiency of the light emitting layer. Here, the cross-sectional dimension of the air gap can be the diameter of the cross section of the air gap, or the length or width of the cross section of the air gap.

Figure 5:
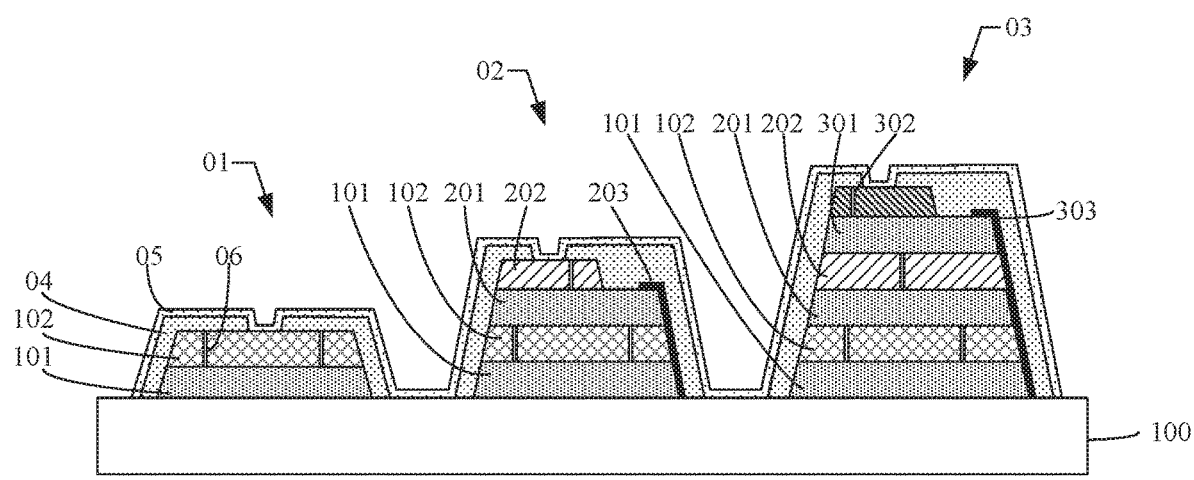
FIG. 5 is a cross-sectional view illustrating a multi-color light emitting pixel unit according to an embodiment of the present disclosure.

FIG. 5 is a cross-sectional view illustrating a multi-color light emitting pixel unit 5000, according to an embodiment of the present disclosure. As shown in FIG. 5, each one of the first type of light emitting layer 102, the second type of light emitting layer 202, and the third type of light emitting layer 302 can have a plurality of micro-gap structures 06. Each one of the micro-gap structures 06 extends along a direction perpendicular to the substrate 100, and penetrates the corresponding light emitting layer, such as the first type of light emitting layer 102, the second type of light emitting layer 202, or the third type of light emitting layer 302. When multiple light emitting layers are used in an embodiment, the micro-gap structure 06 is arranged at least one light emitting layer, preferably in the top light emitting layer.

Still referring to FIG. 5, the micro-gap structures 06 are staggered one on another in the multiple light emitting layers. That is, the micro-gap structures 06 in the first type of light emitting layer 102 are not vertically aligned with the micro-gap structures 06 in the second type of light emitting layer 202, and the micro-gap structures 06 in the second type of light emitting layer 202 are not vertically aligned with the micro-gap structures 06 in the third type of light emitting layer 302. In each one of the second type of LED 02 and the third type of LED 03, the micro-gap structures in the first type of light emitting layer 102 is isolated and sealed between the second metal layer 201 at the top of the first type of light emitting layer 102 and the first metal layer 101 at the bottom thereof. In the third type of LED 03, the micro-gap structures 06 in the second type of light emitting layer 202 is isolated and sealed between the third metal layer 301 at the top of the second light emitting layer 202 and the second metal layer 201 at the bottom thereof, and the micro-gap structures 06 in the third type of light emitting layer 302 is isolated and sealed between the top isolation layer 04 at the top of the third type of light emitting layer 302 and the third metal layer 301 at the bottom thereof.

In a similar manner, in a multi-color light emitting pixel unit including first to Mth types of LEDs in another embodiment of the present disclosure, the Mth type of LED has M light emitting layers and a metal layer is arranged at the bottom of each light emitting layer, wherein M is positive integer and greater than or equal to number two. In each one of the first to Mth type of LEDs, a top conductive layer (as an upper conductive layer) is arranged at the top of a top light emitting layer, so that the micro-gap structure in the top light emitting layer can be isolated and sealed between the top conductive layer and the metal layer at the bottom of the top light emitting layer. The micro-gap structure in every light emitting layer is isolated and sealed between the metal layers separately at the top and bottom of the relative light emitting layer.

In addition, similar to the multi-color light emitting pixel units 1000 to 4000 in FIGS. 1 to 4, a multi-color light emitting pixel unit according to another embodiment of the present disclosure includes a plurality of LEDs, including a first type of LED to a Mth type of LED. The Mth type of LED includes, at least, all of the light emitting layers and metals layers constructed in the (M−1)th type of LED, and an Mth light emitting layer and an Mth metal layer. On the basis thereof, the Mth type of LED has an (M−1)th electrical connector which connects to the Mth metal layer, the (M−1)th metal layer, . . . , and the first metal layer. Furthermore, the (M−1)th electrical connector can connect to the Mth metal layer, the (M−1)th type of light emitting layer, the (M−1)th metal layer, . . . , the first type of light emitting layer, and the first metal layer. The arrangement of the (M−1)th electrical connector can be referred to the description of the first electrical connector 203 in the FIG. 1. The first to the (M−1)th electrical connectors connect the first to Mth metal layers, and the first to the (M−1)th electrical connectors can directly contact the substrate and the first metal layer. Herein, there is a difference from the first type of LED to the Mth type of LED. Additionally, every kind of LED can be selected from one of the red LED, green LED, blue LED, yellow LED, orange LED, purple LED or cyan LED. Herein, the different color LEDs are conventional LEDs, which can be known by those skilled in the art and will not be described herein. Furthermore, the first type of LED to the Mth type of LED are spaced apart on the same substrate. A top isolation layer covers the exposed surface of the substrate and that of the first to Mth types of LEDs. The top isolation layer of every type of LED has an opening thereof and a transparent conductive layer covers the surface of the top isolation layer and is filled in the opening, wherein the transparent conductive layer at the bottom of the opening electrically contacts the top light emitting layer of every type of LED. Referring to FIGS. 4 and 5, in the pixel unit having M types of LEDs, the size of the light emitting areas of the first to Mth types of LEDs are different from each other. According to the arrangement of the LEDs in the pixel unit, the size of the light emitting area of the first type of LED is larger than those of the other types of LEDs. Optionally, the first type of LED is a red LED which has the larger light emitting area than those of the other types of LEDs. Alternatively, the other types of LEDs at least include a green LED or a blue LED.

A multi-color micro-display panel is also provided according to an embodiment of the present disclosure. The micro-display panel includes a plurality of multi-color pixel units which are arranged in a matrix. The multi-color pixel units herein can be the LED pixel units mentioned above.

Hereafter combined with the drawings, the method of fabricating the multi-color light emitting pixel unit will be further described below.

Figure 6:
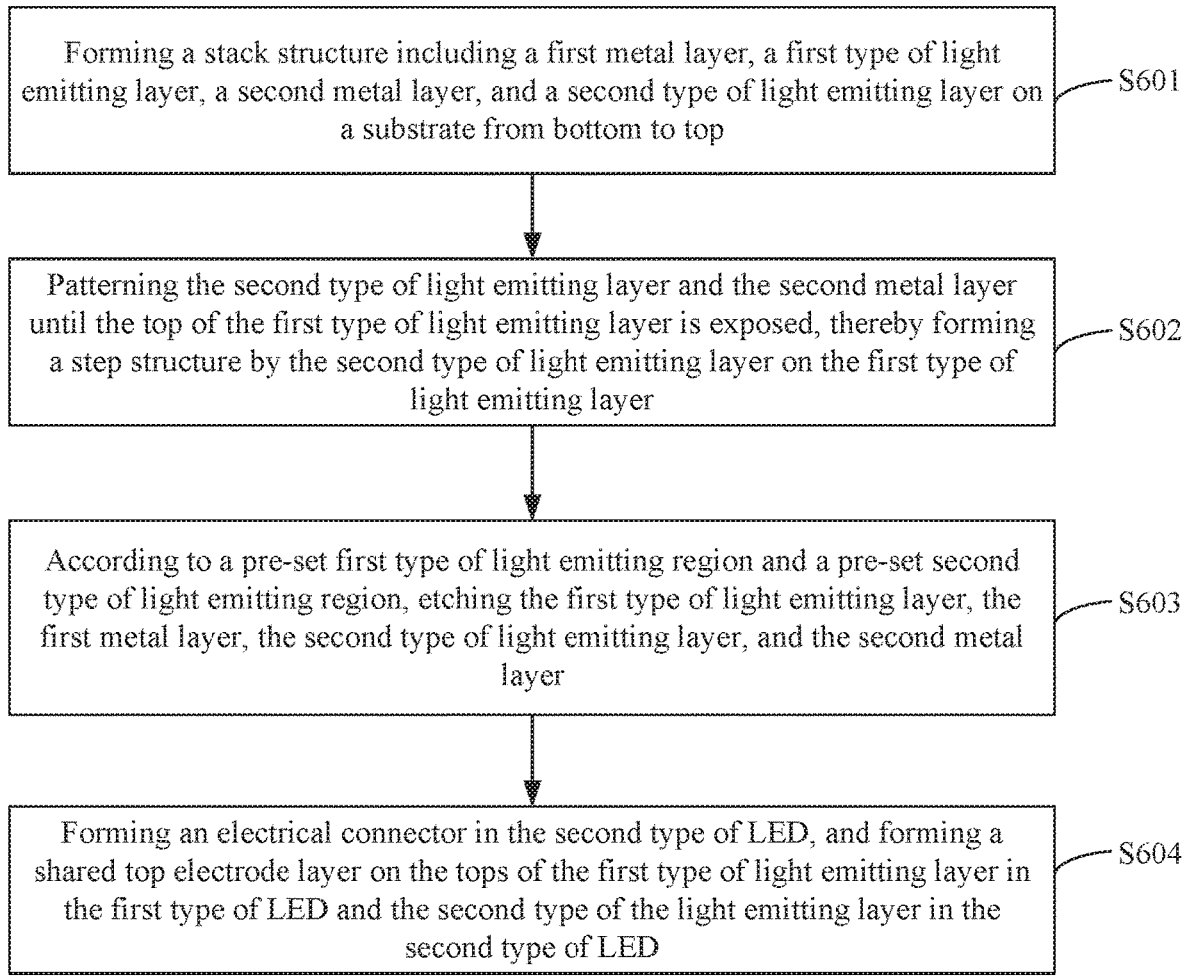
FIG. 6 is a flow chart illustrating a method of fabricating the multi-color light emitting pixel unit illustrated in FIG. 1, according to an embodiment of the present disclosure.

FIG. 6 is a flow chart illustrating a the method of fabricating the multi-color light emitting pixel unit shown in FIG. 1, according to an embodiment of the present disclosure. FIGS. 7 to 10 are cross-sectional views illustrating structures formed in the steps illustrated in FIG. 6, according to an embodiment of the present disclosure. Referring to FIG. 6, the method of fabricating the multi-color light emitting pixel unit as shown in FIG. 1 includes the following steps.

Figure 7:
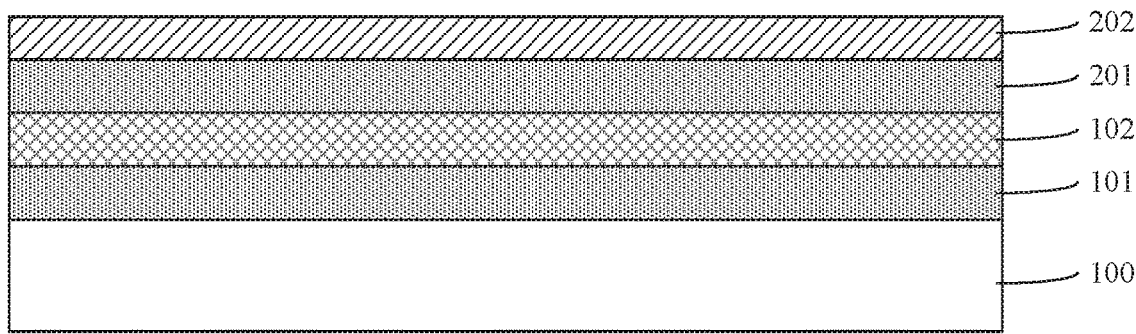
FIGS. 7 to 10 are cross-sectional views illustrating structures formed in the steps of the method in FIG. 6, according to an embodiment of the present disclosure.

In step S601, referring to FIG. 7, a stack structure including a first metal layer 101, a first type of light emitting layer 102, a second metal layer 201, and a second type of light emitting layer 202, are formed on a substrate 100 from bottom to top. In other words, the first type of light emitting layer 102 and the second type of light emitting layer 202 are stacked on the substrate 100 from bottom to top. The first metal layer 101 is formed at the bottom of the first type of light emitting layer 102. The second metal layer 201 is formed at the bottom of the second type of light emitting layer 202. The second metal layer 201 is arranged between the first type of light emitting layer 102 and the second light emitting layer 202.

More specifically, the substrate 100 can be, but not limited to, an IC substrate.

Figure 11:
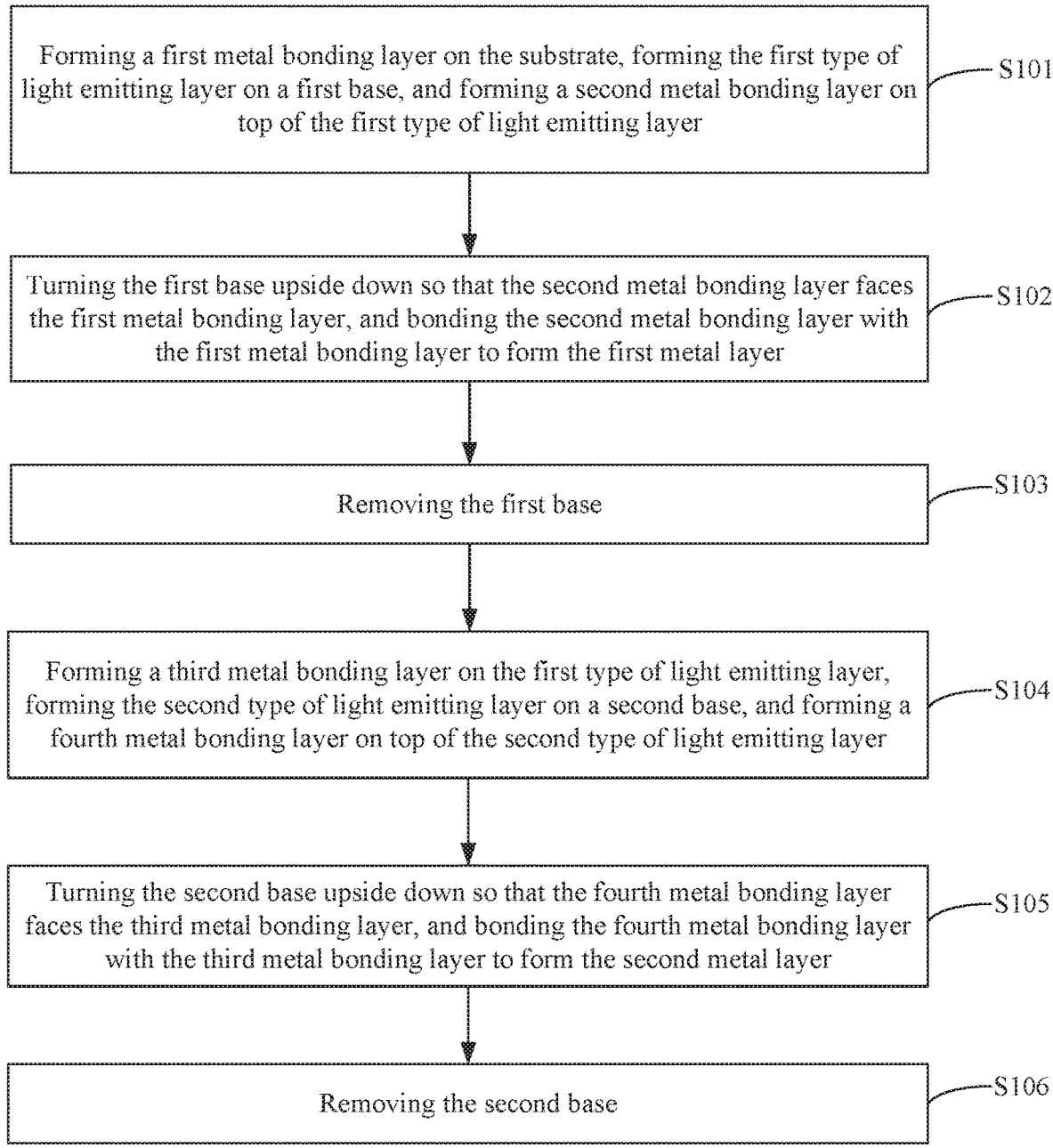
FIG. 11 is a flow chart illustrating details of step S601 in FIG. 6, according to an embodiment of the present disclosure.

FIG. 11 is a flow chart illustrating the details of step S601 in FIG. 6, according to an embodiment of the disclosure. FIGS. 12 to 21 are cross-sectional views illustrating structures formed in the steps illustrated FIG. 11, according to an embodiment of the present disclosure. Referring to FIG. 11, step S601 further includes the following specific steps.

Figure 12:
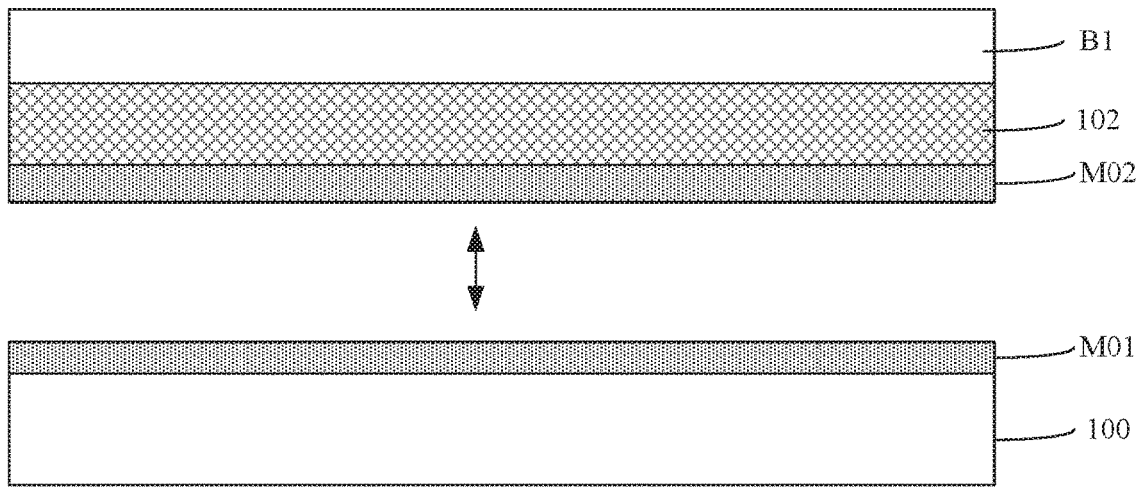
FIGS. 12 to 21 are cross-sectional views illustrating structures formed in the steps in FIG. 11, according to an embodiment of the present disclosure.

In step S101, referring to FIG. 12, a first metal bonding layer M01 is formed on the substrate 100, the first type of light emitting layer 102 is formed on a first base B1, and a second metal bonding layer M02 is formed on top of the first type of light emitting layer 102.

More specifically, the first metal bonding layer M01 can be prepared by, but not limited to, physical vapor deposition, such as evaporation, sputtering, etc. The material of the first base B1 is designed according to the first type of light emitting layer 102. For example, the first base B1 can be a gallium nitride (GaN) base. The first type of light emitting layer 102 can be formed by, but not limited to, epitaxial growth on the first base B1. The second metal bonding layer M02 can be prepared by, but not limited to, physical vapor deposition, such as evaporation.

Figure 13:
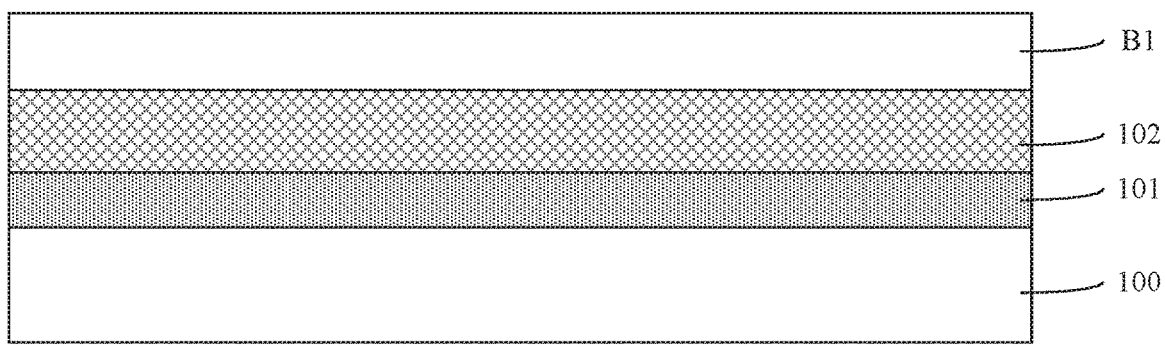

In step S102, referring to FIG. 13 combined with FIG. 12, the first base B1 is turned upside down so that the second metal bonding layer M02 faces the first metal bonding layer M01, and then the second metal bonding layer M02 is bonded with the first metal bonding layer M01 to form the first metal layer 101.

Figure 14:
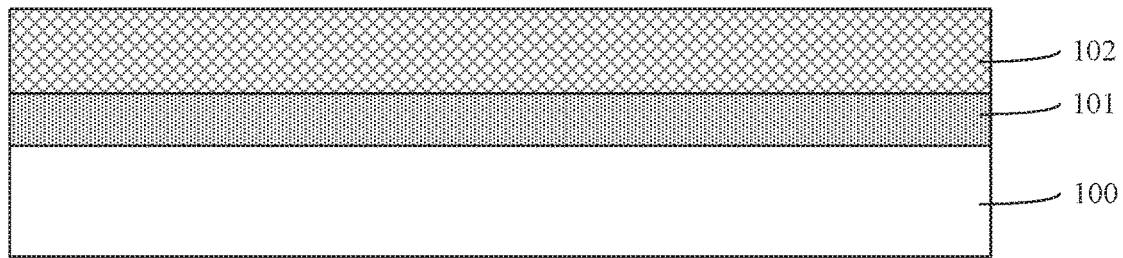

In step S103, referring to FIG. 14 combined with FIG. 13, the first base B1 is removed.

Figure 15:
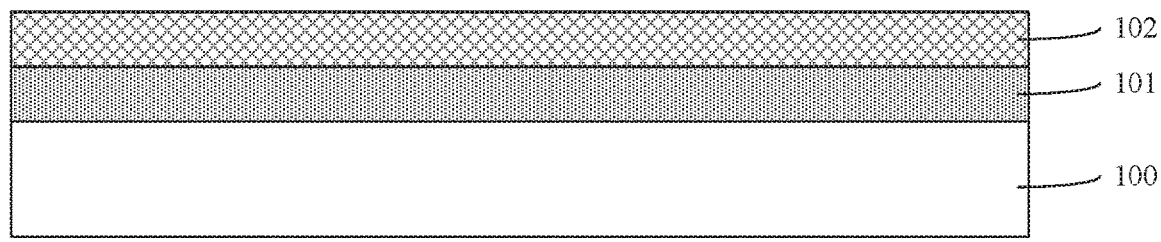

Herein, after the first base B1 is removed, referring to FIG. 15, the step S103 can further includes: thinning the first type of light emitting layer 102.

Figure 16:
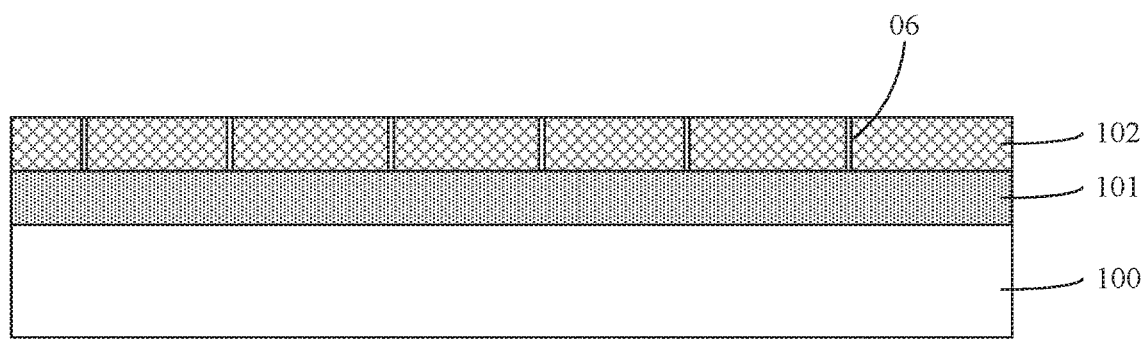

In addition, according to an embodiment, after the first base B1 is removed or the first type of light emitting layer 102 is thinned, and before the third metal bonding layer is formed, referring to FIG. 16, step S103 can further include: forming micro-gap structures 06 in the first type of light emitting layer 102. The micro-gap structures 06 are formed by, but not limited to, photolithography and etching. In photolithography, a lithography pattern is designed according to the dimension of the micro-gap structure 06. According to an embodiment, a cross-sectional dimension of the micro-gap structure pattern is not more than 2 nm. Here, the cross-sectional dimension of the air gap can be the diameter of the cross section of the air gap, or the length or width of the cross section of the air gap.

Figure 17:
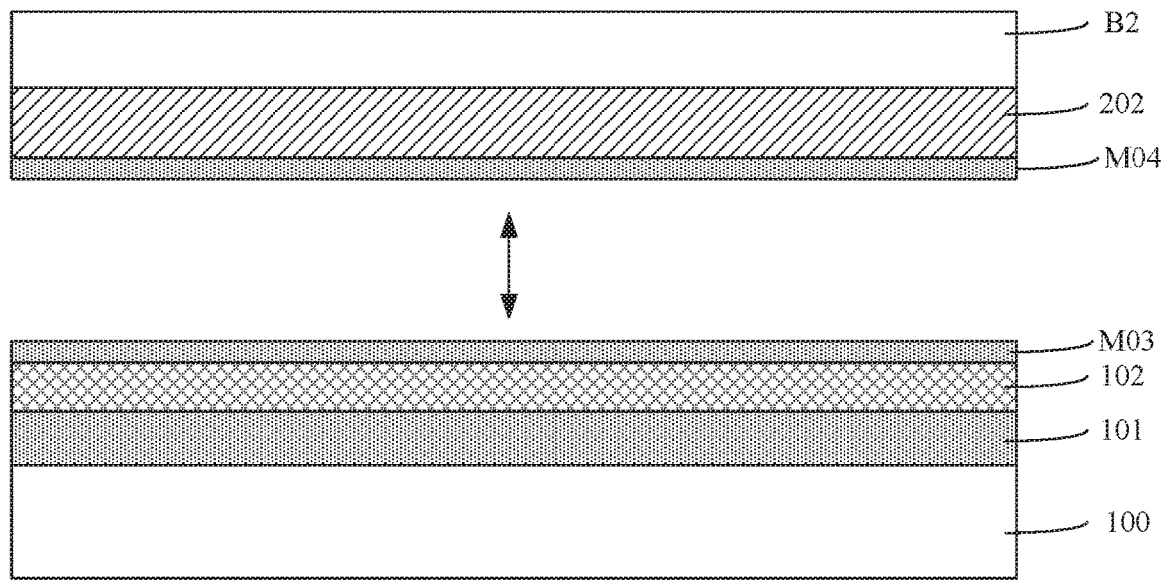

In step S104, referring to FIG. 17, a third metal bonding layer M03 is formed on the first type of light emitting layer 102, the second type of light emitting layer 202 is formed on a second base B2, and a fourth metal bonding layer M04 is formed on top of the second type of light emitting layer 202.

Figure 18:
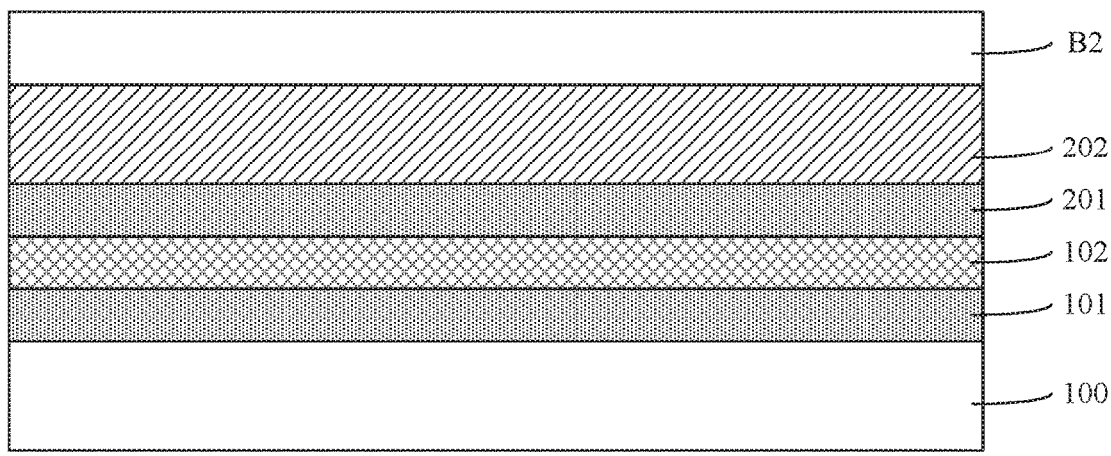

In step S105, referring to FIG. 18 combined with FIG. 17, the second base B2 is turned upside down, so that the fourth metal bonding layer M04 faces the third metal bonding layer M03, and bonding the fourth metal bonding layer M04 with the third metal bonding layer M03 to form the second metal layer 201.

Figure 19:
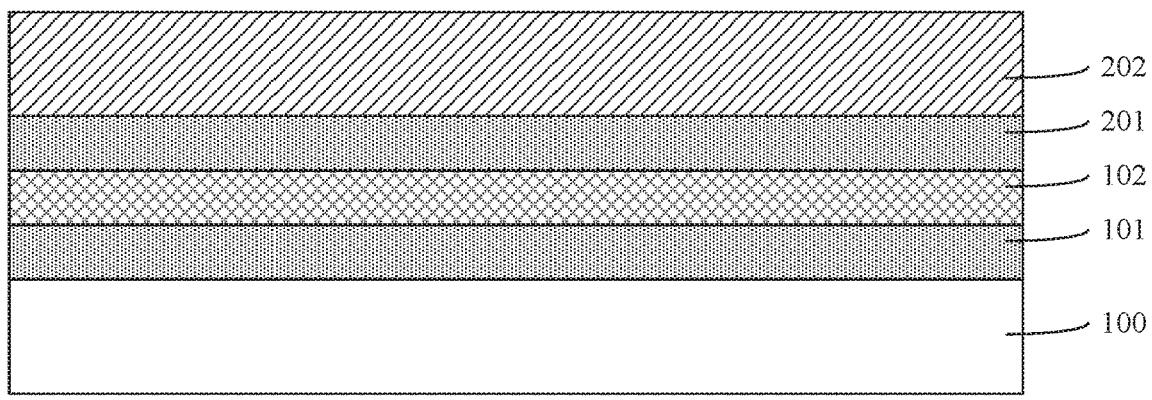

In step S106, referring to FIG. 19 combined with FIG. 18, the second base B2 is removed.

Figure 20:
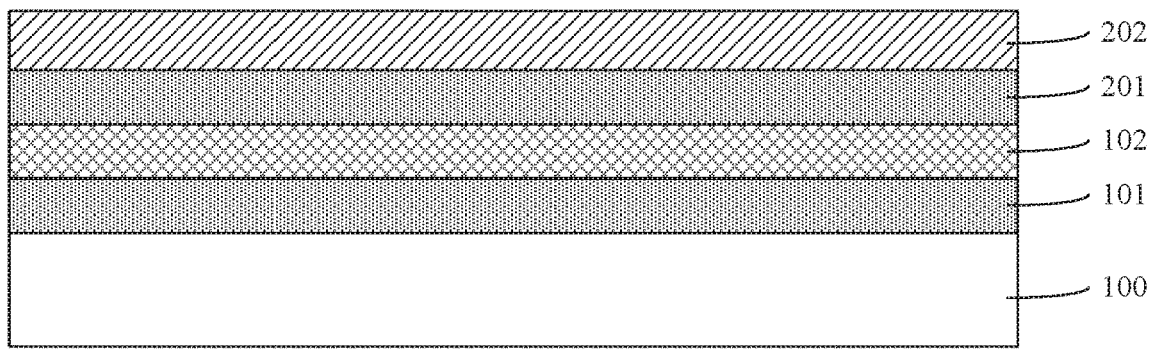

Herein, after the second base B2 is removed, referring to FIG. 20, in step S106, the second type of light emitting layer 202 is thinned.

Figure 21:
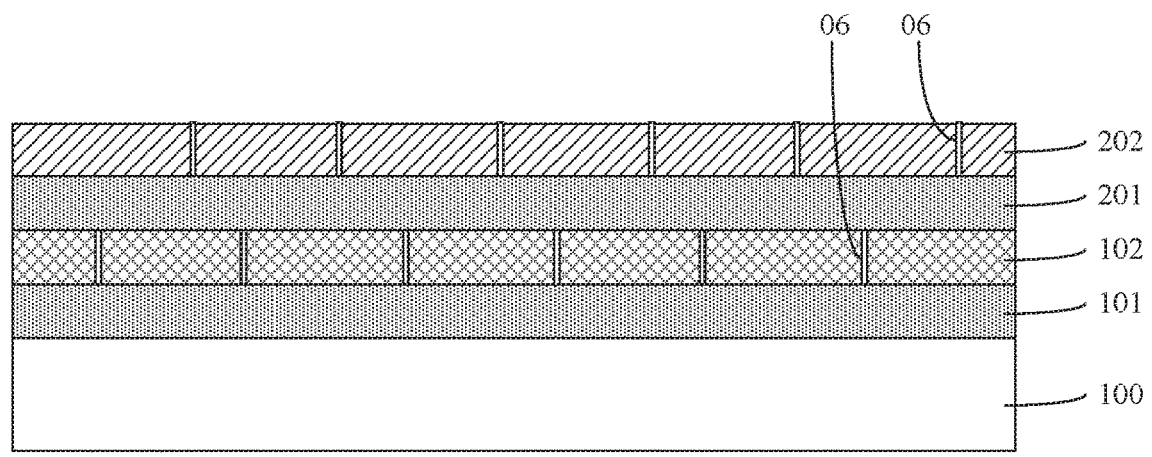

According to an embodiment, after the second base B2 is removed or the second type of light emitting layer 202 is thinned, referring to FIG. 21, in the step S106, micro-gap structures 06 are formed in the second type of light emitting layer 202. The micro-gap structures 06 are formed using a process similar to the process of forming the micro-gap structure 06 in the first type of light emitting layer 102. Therefore, descriptions of the process of forming the micro-gap structures 06 in the second type of light emitting layer 202 will not be repeated.

Referring back to FIGS. 6-10, the process after step S601 according to the embodiment of the present disclosure will be further described hereafter.

Figure 8:
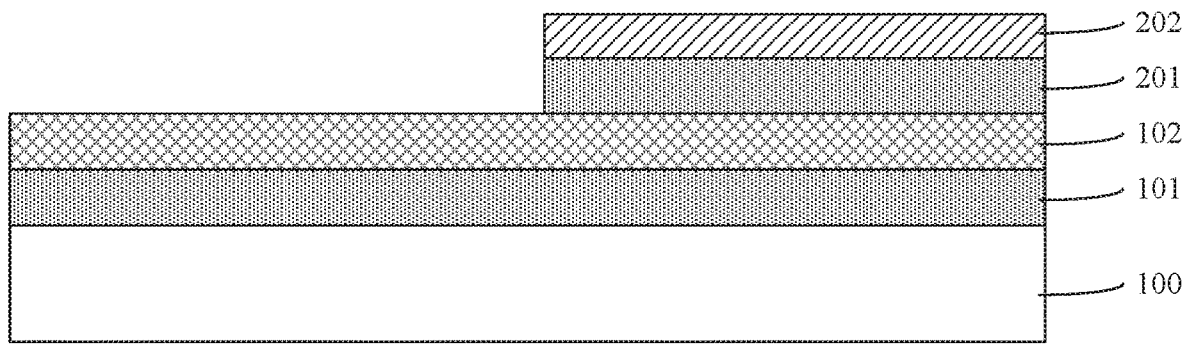

In step S602, referring to FIG. 8, the second type of light emitting layer 202 and the second metal layer 201 are patterned until a portion of the top of the first type of light emitting layer 102 is exposed, thereby forming a step structure made by the second type of light emitting layer 202 on the first type of light emitting layer 102.

More specifically, the process of patterning the second type of light emitting layer 202 and the second metal layer 201 can be performed by photolithography and plasma etching. The process of patterning the second type of light emitting layer 202 and the second metal layer 201 also includes: over etching the top of the first type of light emitting layer 102. The parameters of the patterning process can be set according to actual needs, which will not be limited herein.

Figure 9:
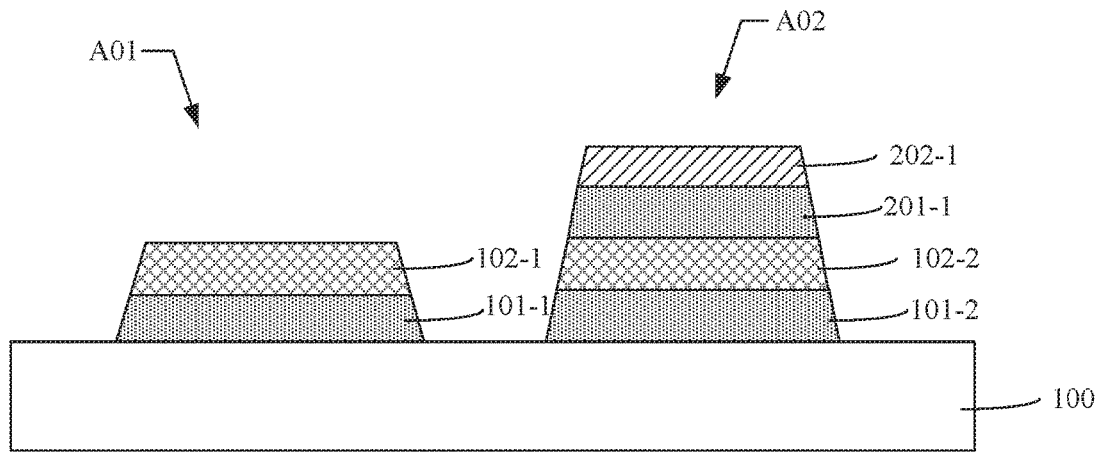

In step S603, referring to FIG. 9, according to a pre-set first type of light emitting region A01 and a pre-set second type of light emitting region A02, the second type of light emitting layer 202, the second metal layer 201, the first type of light emitting layer 102, and the first metal layer 101 are etched, so as to segment the first type of light emitting layer 102 in the first type of light emitting region A01 from the first type of light emitting layer 102 in the second type of light emitting region A02, and to segment the first metal layer 101 in the first type of light emitting region A01 from the first metal layer 101 in the second type of light emitting region A02. As a result of step S603, a first type of LED 01 including a first segment of the first metal layer 101-1 and a first segment of the first type of light emitting layer 102-1, and a second type of LED 02 including a second segment of the first metal layer 101-2, a second segment of the first type of light emitting layer 102-2, a first segment of the second metal layer 201-1, and a second segment of the second type of light emitting layer 202-1 are formed.

Herein, the process of etching the second type of light emitting layer 202, the second metal layer 201, the first type of light emitting layer 102, and the first metal layer 101 is performed by photolithography and etching. The parameters of the process of etching can be set according to the actual needs.

According to an embodiment, as a result of step S603, a plurality of multi-color light emitting pixel units are segmented from each other according to a pre-set pixel unit array. In this manner, the light emitting transistors in a pixel unit and/or in an array of pixel units can be prepared by one segmenting step, which simplifies the process and decreases the production cost, especially facilitates the large-scale production.

Figure 10:
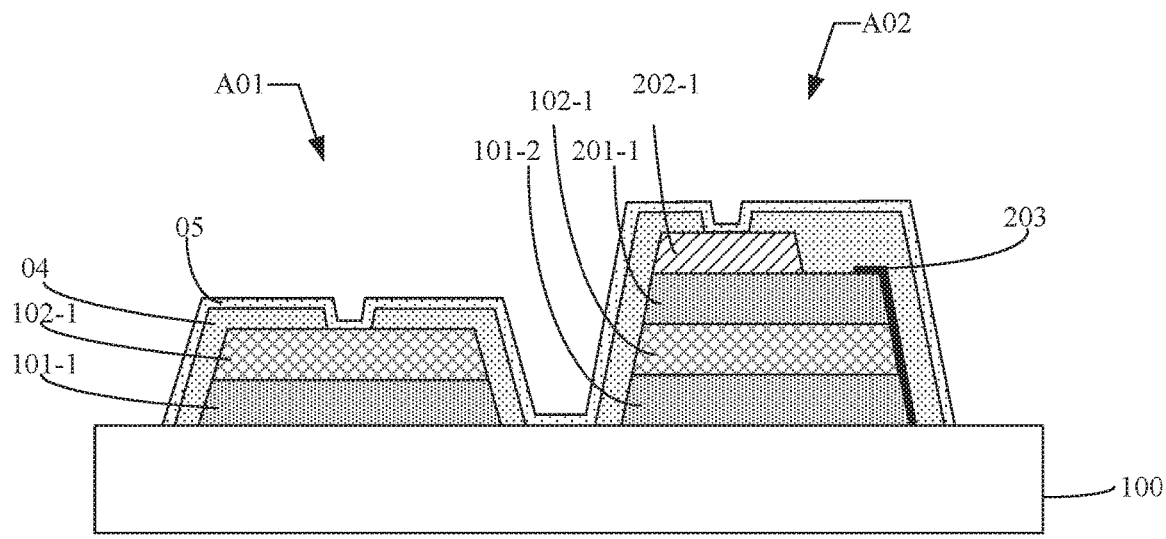

In step S604, referring to FIG. 10, a shared top electrode layer 05, which functions as an extraction electrode of the second metal layer 201, is formed on the tops of the first segment of the first type of light emitting layer 102-1 and the first segment of the second type of the light emitting layer 202-1 in the second type of light emitting region A02.

Figure 22:
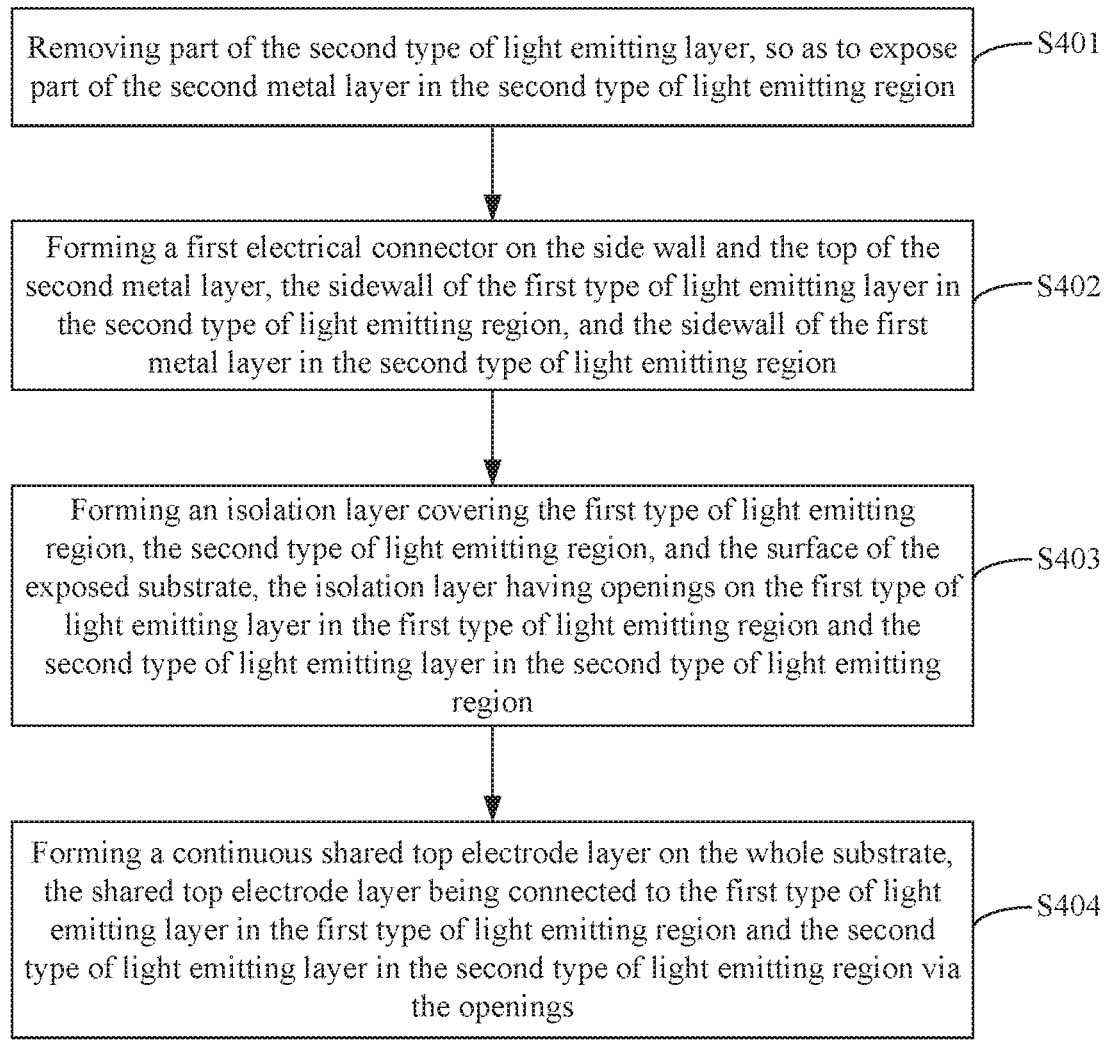
FIG. 22 is a flow chart illustrating details of step S604 in FIG. 6, according to an embodiment of the present disclosure.
Figure 23:
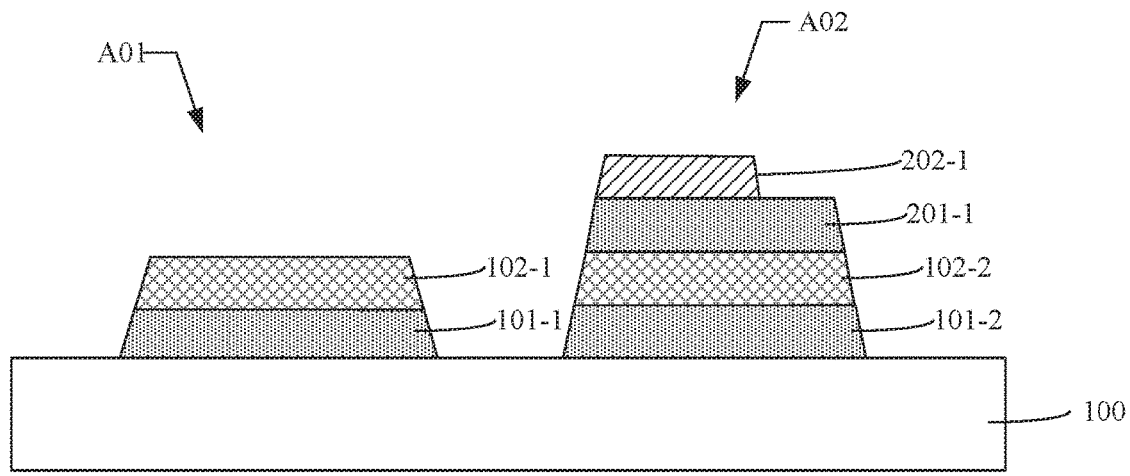
FIGS. 23 to 25 are cross-sectional views illustrating structures formed in the steps in FIG. 22, according to an embodiment of the present disclosure.
Figure 24:
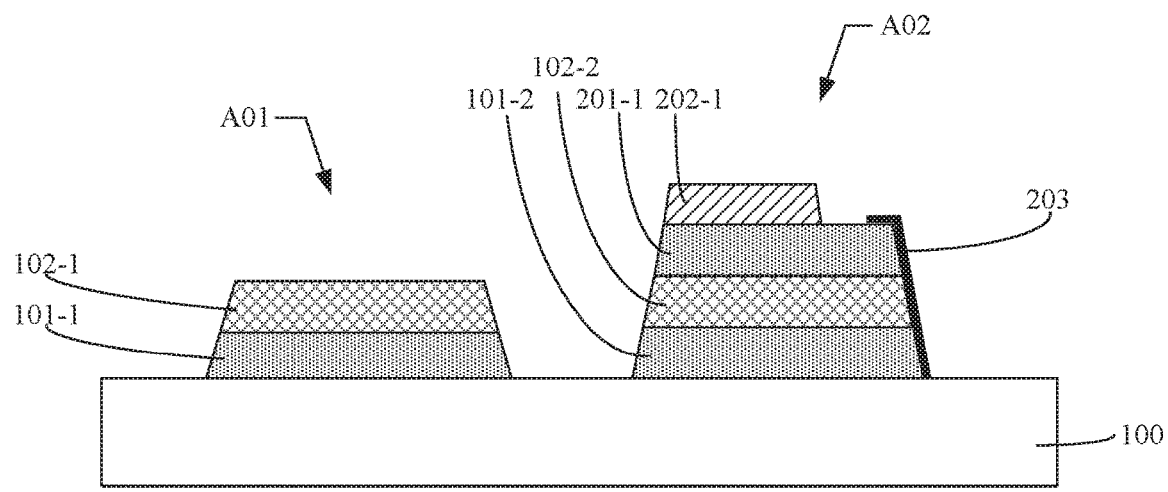
Figure 25:
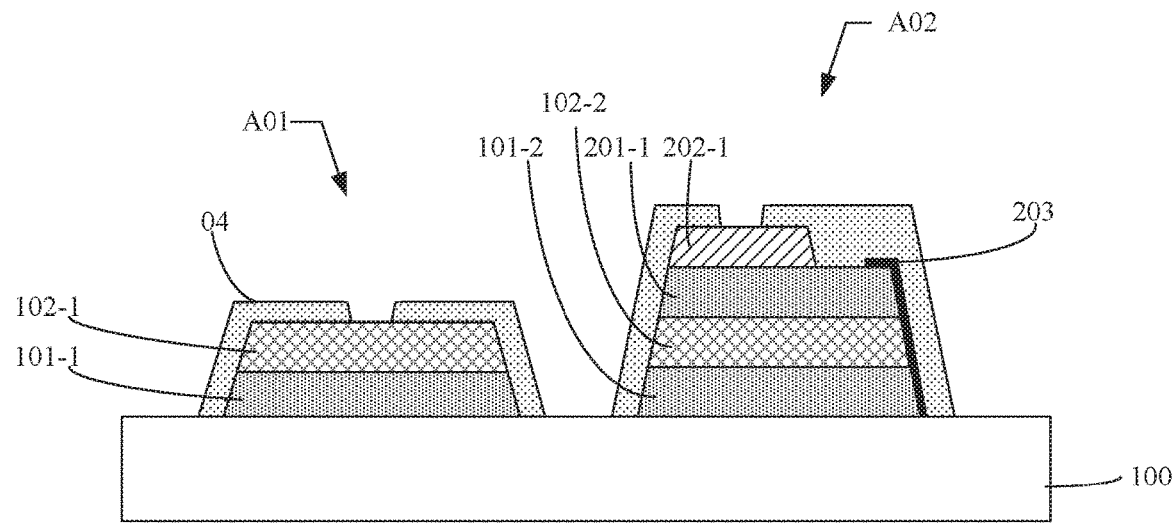

FIG. 22 is a flow chart illustrating the details of step S604 in FIG. 6, according to an embodiment of the present disclosure. FIGS. 23 to 25 are cross-sectional views illustrating structures formed in the steps illustrated FIG. 22, according to an embodiment of the present disclosure. Referring to FIG. 22, the specific process of the step S604 includes the following steps.

In step S401, referring to FIG. 23, part of the first segment of the second type of light emitting layer 202-1 is removed, so as to expose part of the first segment of the second metal layer 201-1.

In step S402, referring to FIG. 24, the first electrical connector 203 is formed on the side wall and the top of the first segment of the second metal layer 201-1, the sidewall of the second segment of the first type of light emitting layer 102-2, and the sidewall of the second segment of the first metal layer 101-2 in the second type of light emitting region A02.

Figure 26:
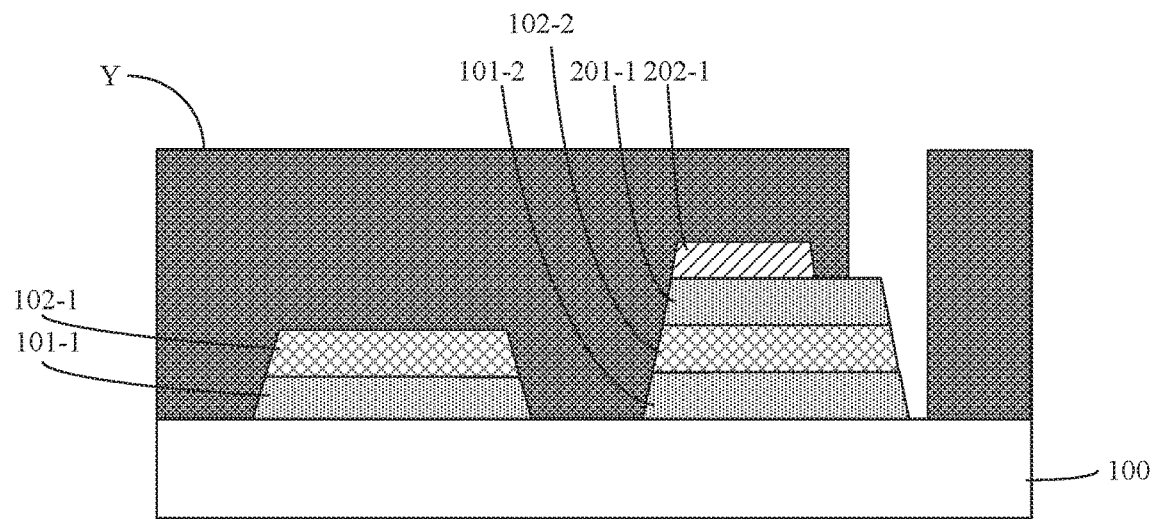
FIGS. 26 and 27 are cross-sectional views illustrating structures formed during a process of fabricating a first electrical connector, according to an embodiment of the present disclosure.
Figure 27:
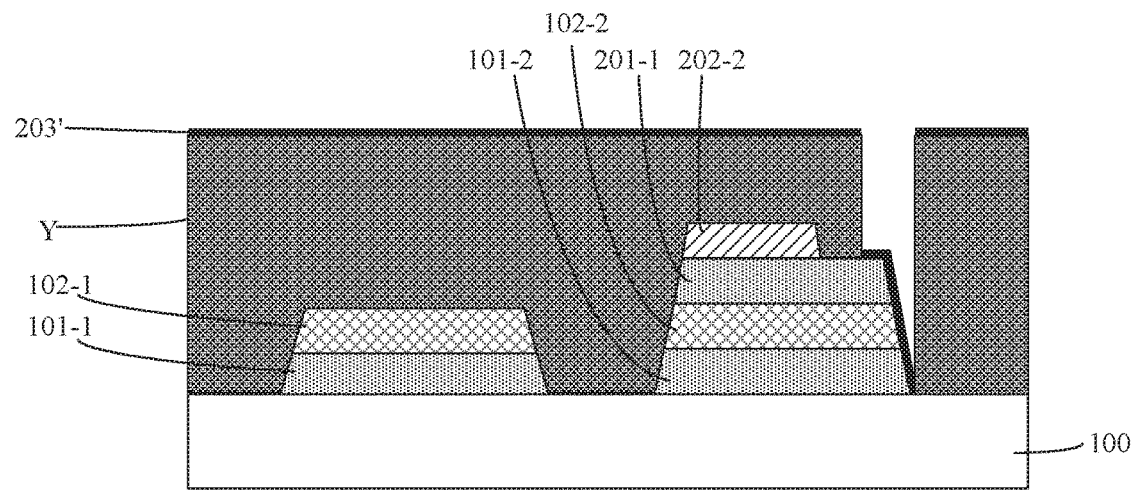

FIGS. 26 to 27 are cross-sectional views illustrating structures formed in the step of fabricating the first electrical connector 203, according to an embodiment of the present disclosure. In step S402, the first electrical connector 203 is formed by the following specific steps.

In step S4021, referring to FIG. 26 combined with FIG. 24, a mask Y is formed to shield the region without the first electrical connector 203, thereby exposing the top and the sidewall of the first segment of the second metal layer 201-1, the sidewall of the second segment of the first type of light emitting layer 102-2, and the sidewall of the second segment of the first metal layer 101-2 in the second type of light emitting region A02.

In step S4022, referring to FIG. 27, a conductive material 203' is deposited on the substrate 100 after completing the step S4021.

In step S4023, referring to FIG. 10 again, the mask Y and the conductive material 203' on the mask Y are removed, so as to form the first electrical connector 203 on the top and the sidewall of the first segment of the second metal layer 201-1, the sidewall of the second segment of the first type of light emitting layer 102-2, and the sidewall of the second segment of the first metal layer 101-2 in the second type of light emitting region A02.

The process of fabricating the shared top electrode layer 05 will be further described hereinafter.

In step S403, referring to FIG. 25, an isolation layer 04 is formed to cover the first type of light emitting region A01, the second type of light emitting region A02, and the surface of the exposed substrate 100. The isolation layer 04 has openings on the first segment of the first type of light emitting layer 102-1 in the first type of light emitting region A01 and the first segment of the second type of light emitting layer 202-1 in the second type of light emitting region A02.

In step S404, referring to FIG. 10 again, the continuous shared top electrode layer 05 is formed on the whole substrate 100 after step S403, by, for example, deposition. The shared top electrode layer 05 formed in the openings is connected to the first segment of the first type of light emitting layer 102-1 in the first type of light emitting region A01 and the first segment of the second type of light emitting layer 202-1 in the second type of light emitting region A02.

Figure 28:
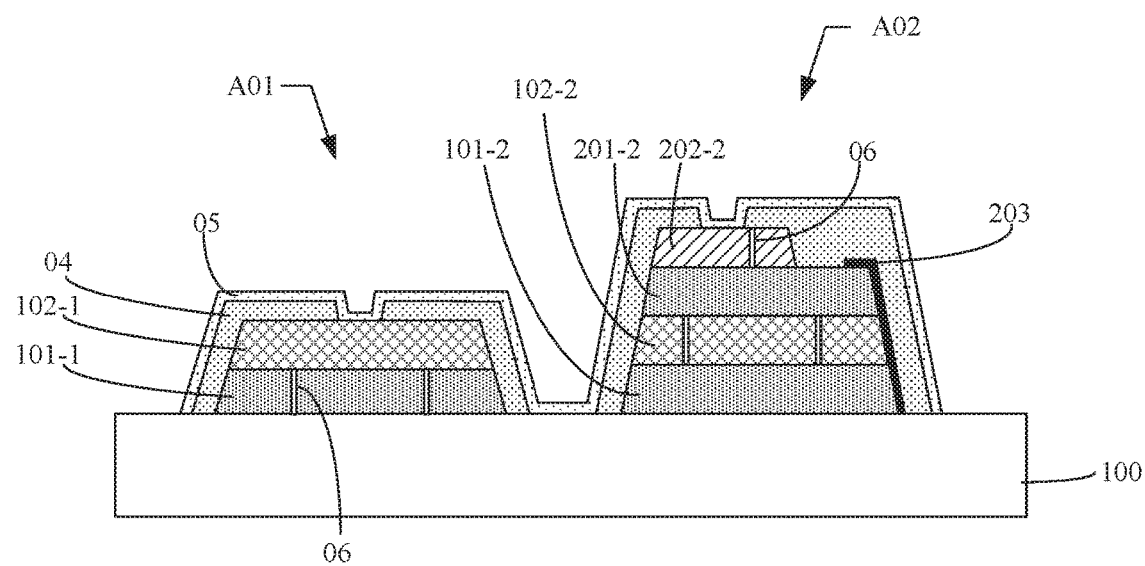
FIG. 28 is a cross-sectional view illustrating a multi-color light emitting pixel unit having micro-gap structures, according to an embodiment of the present disclosure.

FIG. 28 illustrates the structure of the multi-color light emitting pixel unit having micro-gap structures in the first type of light emitting layer 102 and the second type of light emitting layer 202, according to an embodiment of the present disclosure.

FIG. 29 is a flow chart illustrating a method of fabricating the multi-color light emitting pixel unit 3000 as shown in FIG. 3, according to an embodiment of the present disclosure. FIGS. 30 to 34 are cross-sectional views illustrating structures formed in the steps illustrated in FIG. 6, according to an embodiment of the present disclosure. Referring to FIG. 29, the method of fabricating the multi-color light emitting pixel unit 3000 as shown in FIG. 3 includes the following steps.

Figure 30:
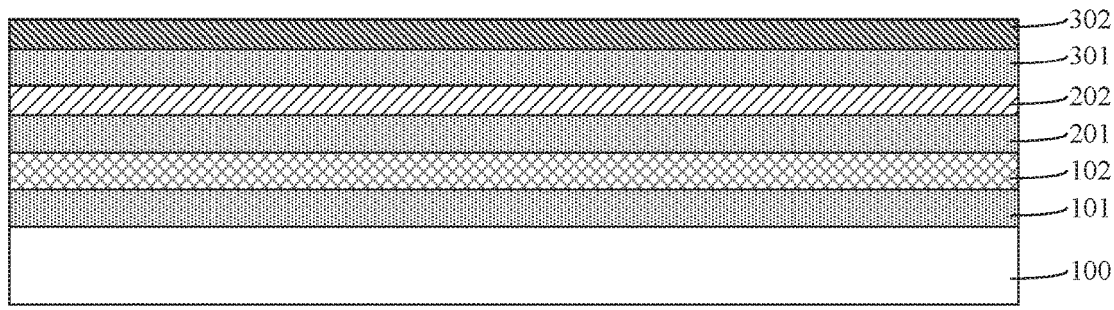
FIGS. 30 to 34 are cross-sectional views illustrating structures formed in the steps of the method in FIG. 29, according to an embodiment of the present disclosure.

In step S701, referring to FIG. 30, a stack structure including a first metal layer 101, a first type of light emitting layer 102, a second metal layer 201, a second type of light emitting layer 202, a third metal layer 301, and a third type of light emitting layer 302 is formed on a substrate 100 in an order from bottom to top. In other words, the first type of light emitting layer 102, the second type of light emitting layer 202, and the third type of light emitting layer 302 are stacked on the substrate 100 from bottom to top. The first metal layer 101 is formed at the bottom of the first type of light emitting layer 102. The second metal layer 201 is formed at the bottom of the second type of light emitting layer 202. The third metal layer 301 is formed at the bottom of the third type of light emitting layer 302. The second metal layer 201 is arranged between the first type of light emitting layer 102 and the second type of light emitting layer 202. The third metal layer 301 is arranged between the second type of light emitting layer 202 and the third type of light emitting layer 302.

Figure 35:
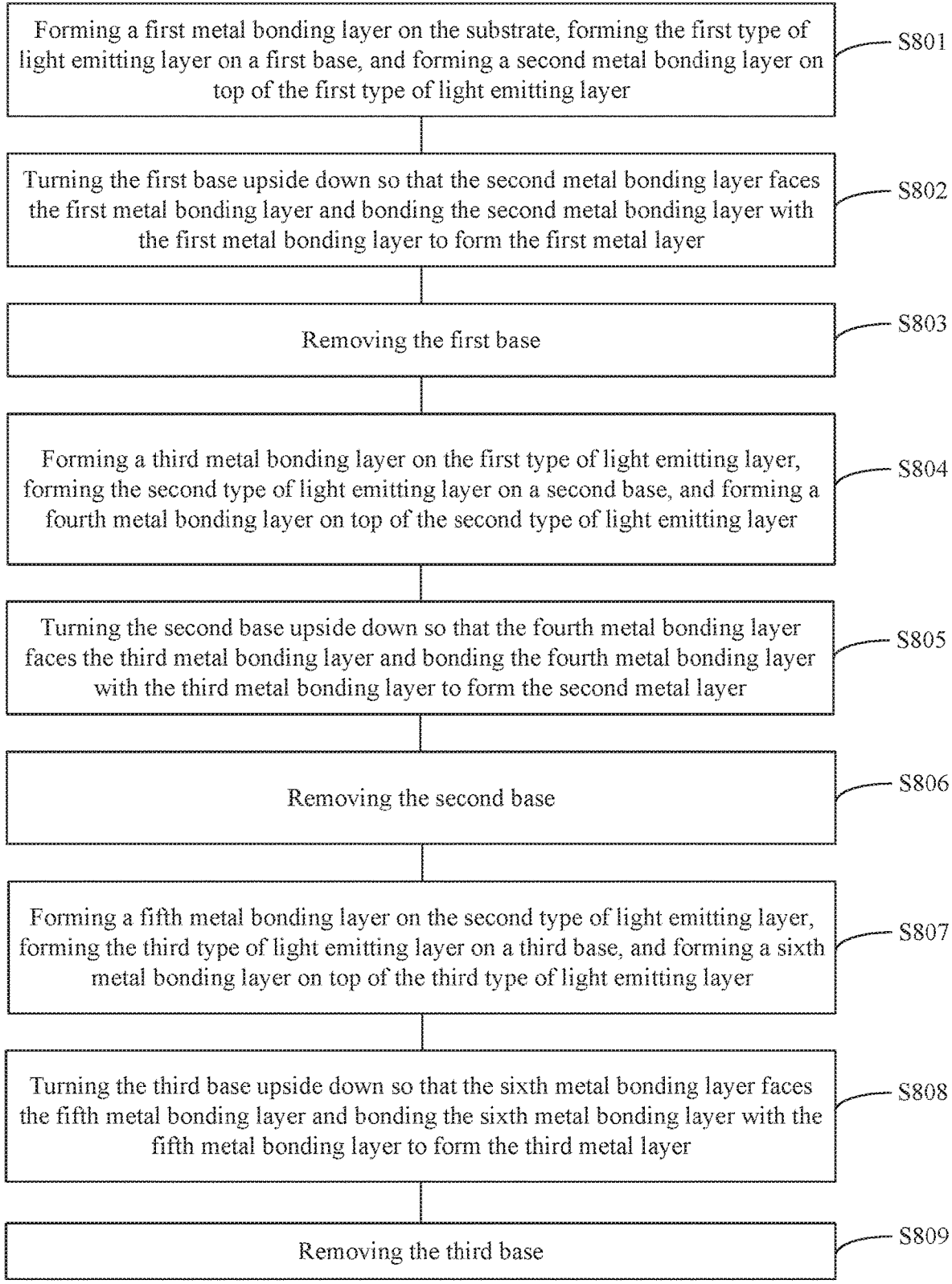
FIG. 35 is a flow chart illustrating details of step S701 in FIG. 29, according to an embodiment of the present disclosure.

FIG. 35 is a flow chart illustrating the details of step S701 in FIG. 29, according to an embodiment of the disclosure. Referring to FIG. 35 combined with FIG. 30, step S701 further includes the following steps. It is noted that, the structures formed in the steps S801 to S809 of the present embodiment are not shown in drawings. But the steps S801 to S809 of the present embodiment can be understood by those of skill in the art with reference to the steps S101 to S109 of the embodiment described above.

In step S801, a first metal bonding layer is formed on the substrate 100, the first type of light emitting layer 102 is formed on a first base, and a second metal bonding layer is formed on the top of the first type of light emitting layer 102.

More specifically, the first metal bonding layer can be prepared by, but not limited to, physical vapor deposition, such as evaporation, sputtering, etc. The material of the first base is designed according to the first type of light emitting layer 10. For example, the first base can be a gallium nitride (GaN) base. The first type of light emitting layer 102 can be made by, but not limited to, epitaxial growth on the first base. The second metal bonding layer can be prepared by, but not limited to, physical vapor deposition, such as evaporation.

In step S802, the first base is turned upside down so that the second metal bonding layer faces the first metal bonding layer, and the second metal bonding layer is bonded with the first metal bonding layer to form the first metal layer 101.

In step S803, the first base is removed.

Herein, after the first base is removed, step S803 can further include: thinning the first type of light emitting layer 102. In addition, after the first base is removed or the first type of light emitting layer 102 is thinned, and before the third metal bonding layer is formed, referring to FIG. 36, step S803 can further include: forming micro-gap structures 06 in the first type of light emitting layer 102. The micro-gap structures 06 are formed by, but not limited to, photolithography and etching. In photolithography, a lithography pattern is designed according to the dimension of the micro-gap structure 06. According to an embodiment, a cross-sectional dimension of the micro-gap structure pattern is not more than 2 nm.

In step S804, a third metal bonding layer is formed on the first type of light emitting layer 102, the second type of light emitting layer 202 is formed on a second base, and a fourth metal bonding layer is formed on the top of the second type of light emitting layer 202.

In step S805, the second base is turned upside down so that the fourth metal bonding layer faces the third metal bonding layer and then the fourth metal bonding layer is bonded with the third metal bonding layer to form the second metal layer 201.

In step S806, the second base is removed.

Herein, after the second base is removed, step S106 can further include: thinning the second type of light emitting layer 202. In addition, after the second base is removed or the second type of light emitting layer 202 is thinned, referring to FIG. 36, the step S106 further includes: forming micro-gap structures 06 in the second type of light emitting layer 202. The micro-gap structure 06 can be formed using a process similar to the process of forming the micro-gap structure 06 described above. Therefore, description of the process of forming the micro-gap structure 06 will not be repeated.

In step S807, a fifth metal bonding layer is formed on the second type of light emitting layer 202, the third type of light emitting layer 302 is formed on a third base, and a sixth metal bonding layer is formed on top of the third type of light emitting layer 302.

In step S808, the third base is turned upside down so that the sixth metal bonding layer faces the fifth metal bonding layer and then the sixth metal bonding layer is bonded with the fifth metal bonding layer to form the third metal layer 301.

In step S809, the third base is removed.

Herein, after the third base is removed, step S109 can further include: thinning the third type of light emitting layer 302. In addition, after the third base is removed or the third type of light emitting layer 302 is thinned, referring to FIG. 36, the step S109 further includes: forming micro-gap structures 06 in the third type of light emitting layer 302. The micro-gap structure 06 can be formed using a process similar to the process of forming the micro-gap structure 06 described above. Therefore, description of the process of forming the micro-gap structure 06 will not be repeated.

Figure 36:
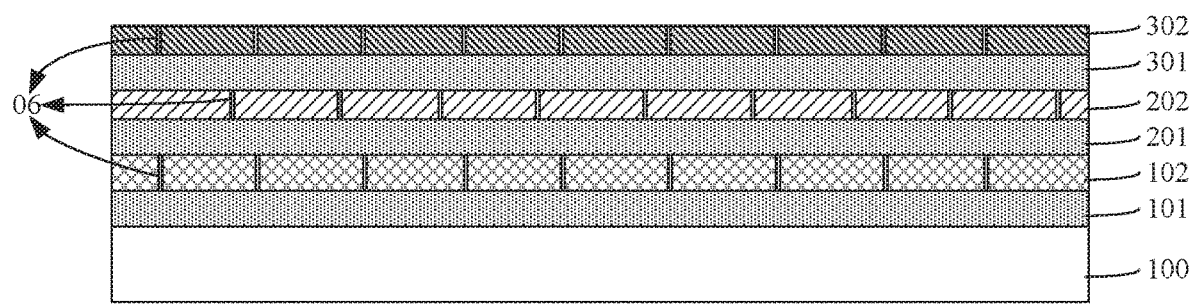
FIG. 36 is a cross-sectional view of micro-gap structures formed in three types of light emitting layers, according to an embodiment of the present disclosure.

FIG. 36 illustrates the micro-gap structures 06 in the first type of light emitting layer 102, the second type of light emitting layer 202, and the third type of light emitting layer 302.

Referring back to FIGS. 30-34, the process after step S701 will be further described hereafter.

Figure 31:
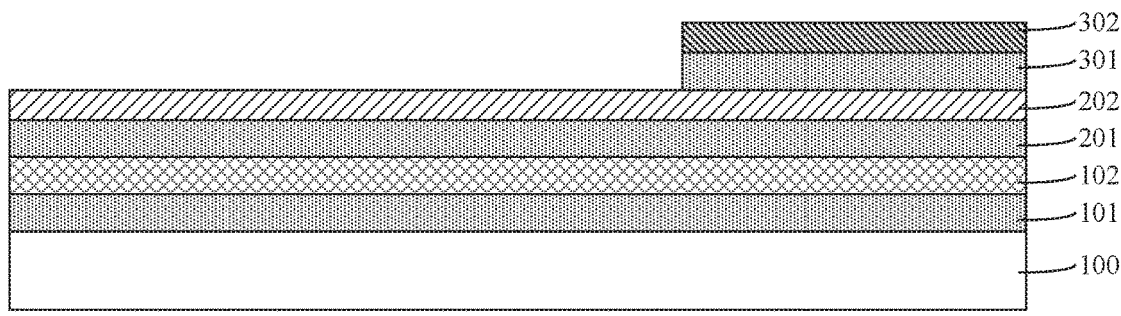

In step S702, referring to FIG. 31, the third type of light emitting layer 302 and the third metal layer 301 are patterned until a portion of the top of the second type of light emitting layer 202 is exposed, thereby forming a step structure made by the third type of light emitting layer 302 on the second type of light emitting layer 202.

More specifically, the step structure includes the third type of light emitting layer 302 and the third metal layer 301. The process of patterning the third type of light emitting layer 302 and the third metal layer 301 also includes: over etching the top of the first type of light emitting layer 102.

Figure 32:
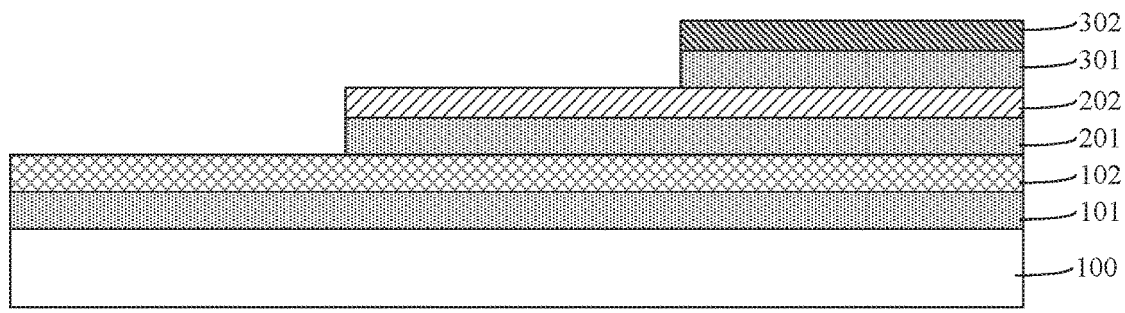

In step S703, referring to FIG. 32, the second type of light emitting layer 202 and the second metal layer 201 are further patterned until a portion of the top of the first type of light emitting layer 202 is exposed, thereby forming a step structure made by the second type of light emitting layer 202 on the first type of light emitting layer 102.

More specifically, the step structure is made by the second type of light emitting layer 202 and the second metal layer 201. The patterning process can be performed by photolithography and plasma etching. The process of patterning the second type of light emitting layer 202 and the second metal layer 201 also includes: over etching the top of the first type of light emitting layer 102. The parameters of the patterning process can be set according to the actual needs, which will not be limited herein.

Figure 33:
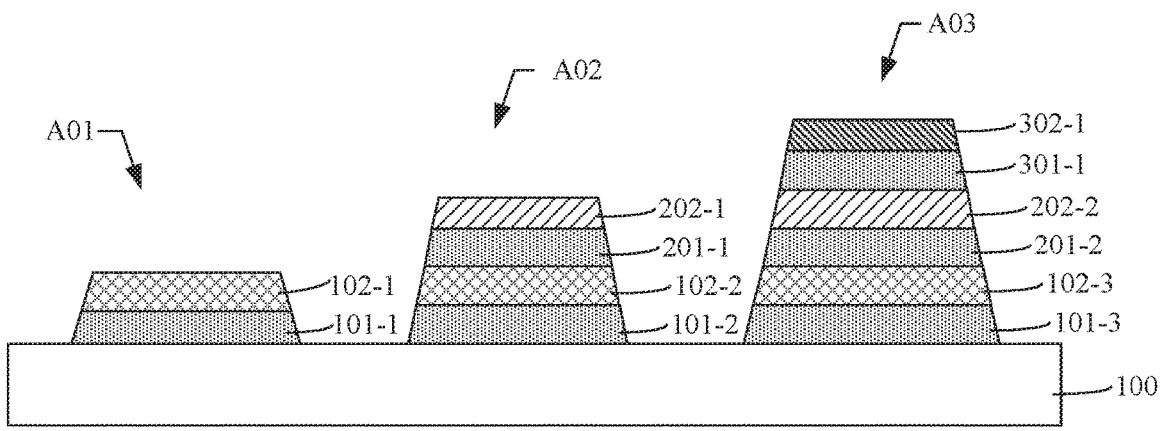

In step S704, referring to FIG. 33, according to a pre-set first type of light emitting region A01, a pre-set second type of light emitting region A02, and a pre-set third type of light emitting region A03, the third type of light emitting layer 302, the third metal layer 301, the second type of light emitting layer 202, the second metal layer 201, the first type of light emitting layer 102, and the first metal layer 101 are etched, so as to segment the first type of light emitting layer 102 in the first type of light emitting region A01 from that in the second type of light emitting region A02 and from that in the third type of light emitting region A03, segment the first metal layer 101 in the first type of light emitting region A01 from that in the second type of light emitting region A02 and from that in the third type of light emitting region A03, segment the second type of light emitting layer 202 in the second type of light emitting region A02 from that in the third type of light emitting region A03, and segment the second metal layer 201 in the second type of light emitting region A02 from that in the third type of light emitting region A03. As a result of step S704, a first type of LED 01 including a first segment of the first metal layer 101-1 and a first segment of the first type of light emitting layer 102-1, a second type of LED 02 including a second segment of the first metal layer 101-2, a second segment of the first type of light emitting layer 102-2, a first segment of the second metal layer 201-1, and a first segment of the second type of light emitting layer 202-1, and a third type of LED 03 including a third segment of the first metal layer 101-3, a third segment of the first type of light emitting layer 102-3, a second segment of the second metal layer 201-2, a second segment of the second type of light emitting layer 202-2, a first segment of the third metal layer 301-1, and a first segment of the third type of light emitting layer 302-1, are formed.

Herein, the etching process is performed by photolithography and etching process, the parameters of which can be set according to the actual needs.

According to an embodiment, as a result of step S704, a plurality of multi-color light emitting pixel units are segmented from each other according to a pre-set pixel unit array. Therefore, the light emitting transistors in a pixel unit and/or in an array of pixel units can be prepared by one segmenting step, which simplifies the process and decreases the production cost, especially facilitates the large-scale production.

Figure 34:
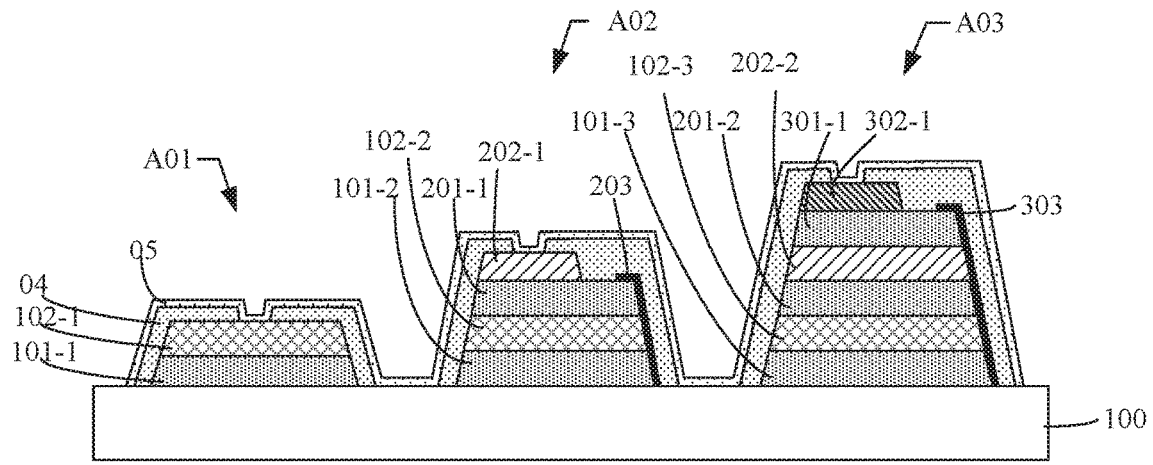

In step S705, referring to FIG. 34, a shared top electrode layer 05, which functions as an extraction electrode of the first segment of the second metal layer 201-1 and an extraction electrode of the first segment of the third metal layer 301-1 is formed on the top of the first segment of the first type of light emitting layer 102-1, the first segment of the second type of light emitting layer 202-1, and the first segment in the third type of light emitting layer 302-1.

Figure 37:
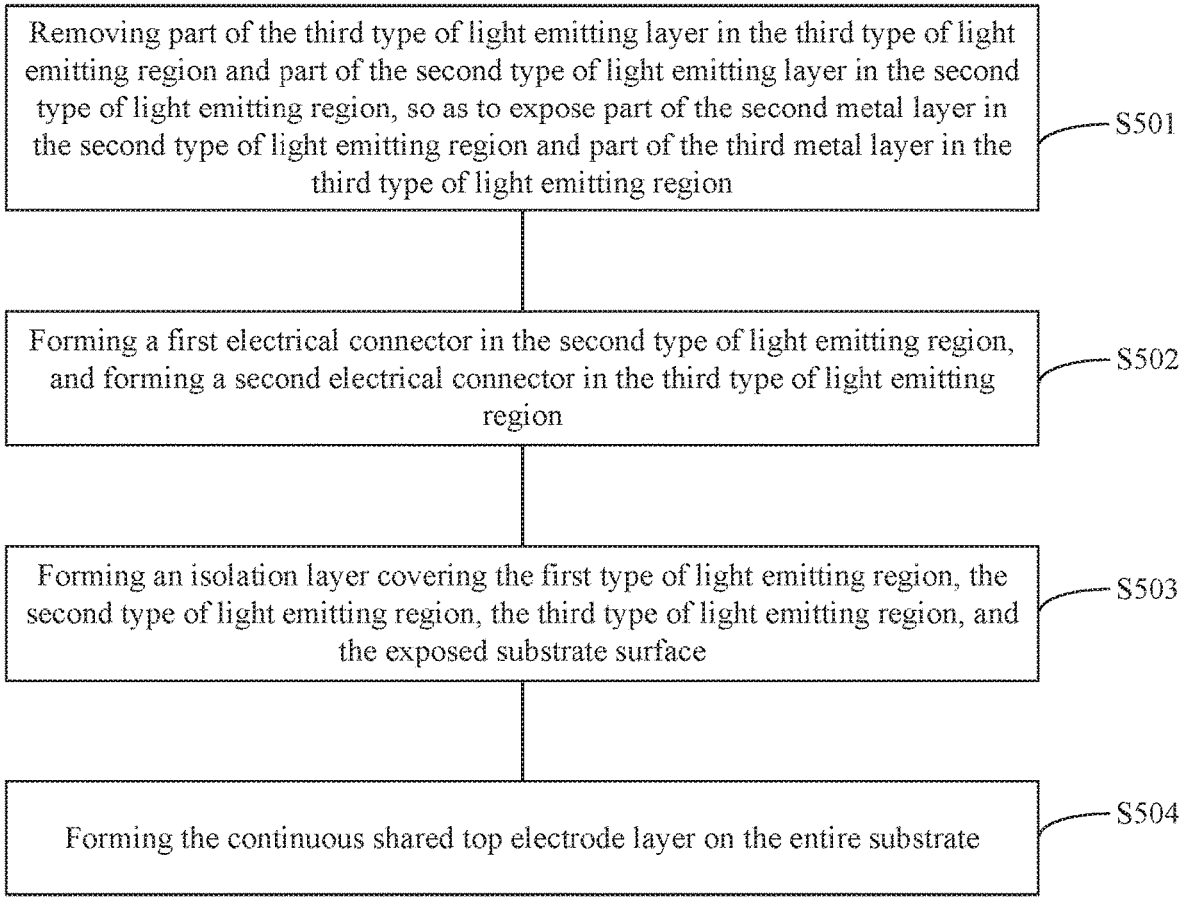
FIG. 37 is a flow chart illustrating details of step S705 in FIG. 29, according to an embodiment of the present disclosure.
Figure 38:
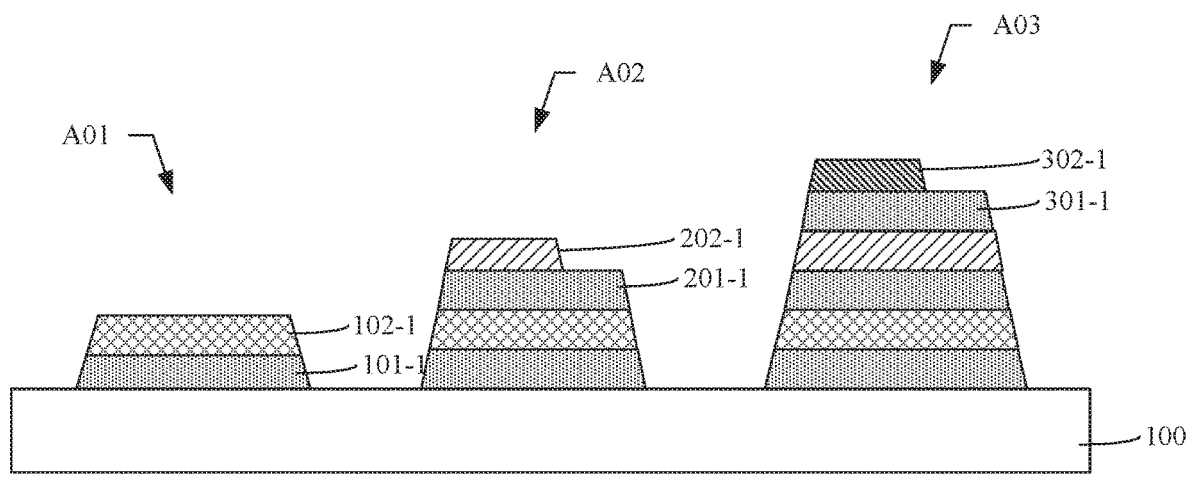
FIGS. 38 to 40 are cross-sectional views illustrating the structures formed in the steps in FIG. 37, according to an embodiment of the present disclosure.
Figure 39:
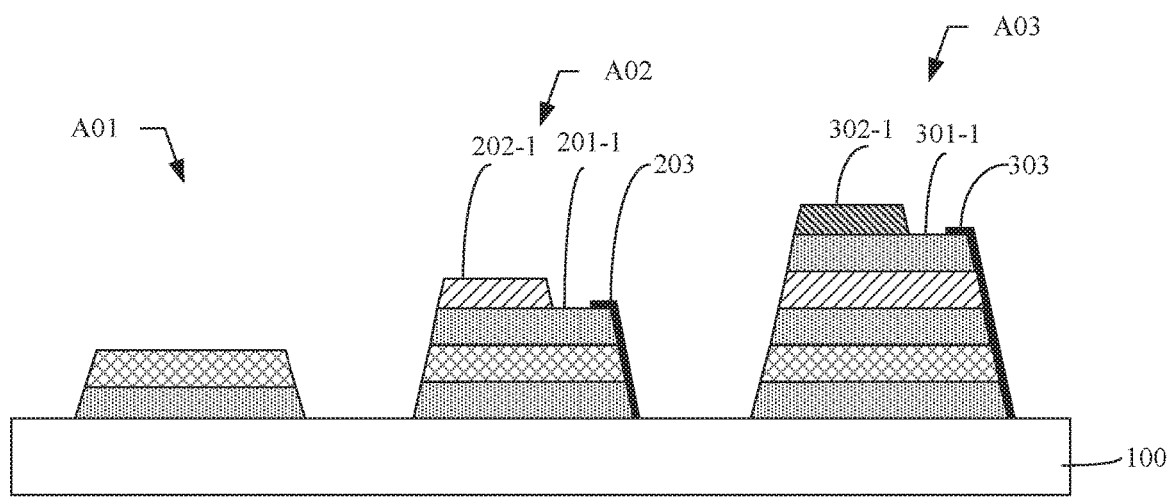
Figure 40:
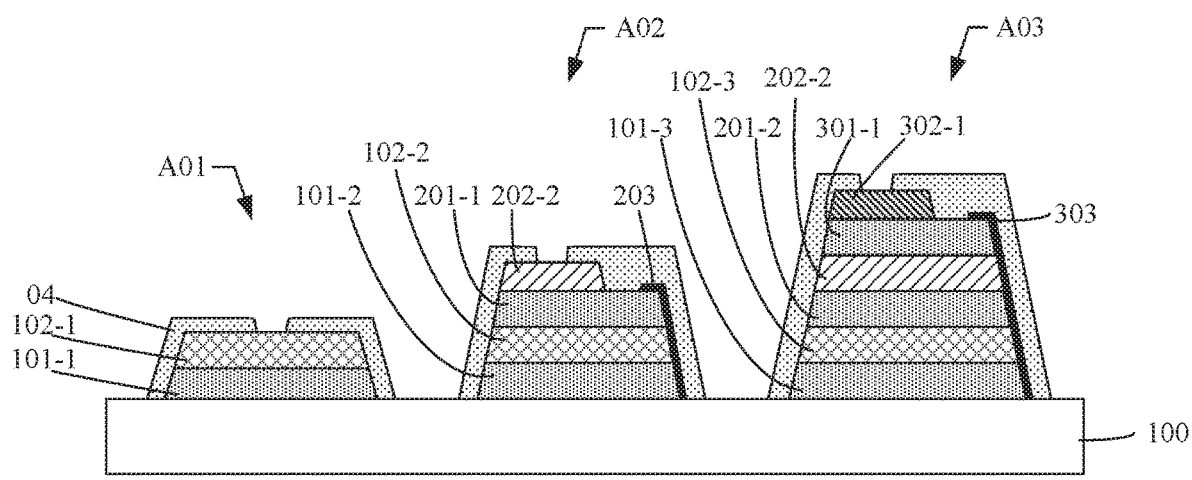

FIG. 37 is a flow chart illustrating the details of step S705 in FIG. 29, according to an embodiment of the present disclosure. FIGS. 38 to 40 are cross-sectional views illustrating structures formed in the steps illustrated in FIG. 37. Referring to FIG. 37, step S705 further includes the following steps.

In step S501, referring to FIG. 38, part of the first segment of the third type of light emitting layer 302-1 and part of the first segment of the second type of light emitting layer 202-1 are removed, so as to expose part of the first segment of second metal layer 201-1 and part of the first segment of the third metal layer 301-1.

In step S502, referring to FIG. 39, the first electrical connector 203 is formed on the side wall and the top of the first segment of the second metal layer 201-1, the sidewall of the second segment of the first type of light emitting layer 102-2, and the sidewall of the second segment of the first metal layer 101-2 in the second type of light emitting region A02, and a second electrical connector 303 is formed on the top and the sidewall of the first segment of the third metal layer 301-1, the sidewall of the second segment of the second type of light emitting layer 202-2, the sidewall of the second segment of the second metal layer 201-2, the sidewall of the third segment of the first type of light emitting layer 102-3, and the sidewall of the third segment of the first metal layer 101-3 in the third type of light emitting region A03.

More specifically, referring to FIG. 39, the process of fabricating the first electrical connector 203 and the second electrical connector 303 further includes the following steps. It is noted that, the following steps S5021 to S5023 are not shown in drawings, but steps S5021 to S5023 can be understood by those of skill in the art with reference to steps S4021 to S4023 of the embodiment described above.

In step S5021, a mask is formed on the substrate 100 to shield the region without the first electrical connector 203, and the second electrical connector 303, thereby exposing the top and the sidewall of the first segment of the second metal layer 201-1, the sidewall of the second segment of the first type of light emitting layer 102-2, and the sidewall of the second segment of the first metal layer 101-2 in the second type of light emitting region A02, and exposing the top and the sidewall of the first segment of the third metal layer 301-1, the sidewall of the second segment of the second type of light emitting layer 202-2, the sidewall of the second segment of the second metal layer 201-2, the sidewall of the third segment of the first type of light emitting layer 102-3, and the sidewall of the third segment of the first metal layer 101-3 in the third type of light emitting region A03.

In step S5022, a conductive material is deposited on the substrate 100 after completing the step S5021.

In step S5023, referring to FIG. 39, the mask and the conductive material on the mask are removed, so as to form the first electrical connector 203 on the top and the sidewall of first segment of the second metal layer 201-1, the sidewall of the second segment of the first type of light emitting layer 102-2, and the sidewall of the second segment of the first metal layer 101-2 in the second type of light emitting region A02, and form the second electrical connector 303 on the top and the sidewall of the first segment of the third metal layer 301-1, the sidewall of the second segment of the second type of light emitting layer 202-2, the sidewall of the second segment of the second metal layer 201-2, the sidewall of the third segment of the first type of light emitting layer 102-3, and the sidewall of the third segment of the first metal layer 101-3 in the third type of light emitting region A03.

The process of fabricating the shared top electrode layer 05 will be further described hereinafter.

In step S503, referring to FIG. 40, an isolation layer 04 is formed to cover the first type of light emitting region A01, the second type of light emitting region A02, the third type of light emitting region A03, and the surface of the exposed substrate 100. The isolation layer 04 has openings on the first segment of the first type of light emitting layer 102-1, on the first segment of the second type of light emitting layer 202-1, and on the first segment of the third type of light emitting layer 302-1.

In step S504, referring to FIG. 34 again, the continuous shared top electrode layer 05 is formed on the entire substrate 100 after step S503. The shared top electrode layer 05 deposited in the openings is connected to the first segment of the first type of light emitting layer 102-1, to the first segment of the second type of light emitting layer 202-1, and to the first segment of the third type of light emitting layer 302.

As mentioned above, in the method of fabricating the multi-color light emitting pixel unit according to the embodiments of the present disclosure, because the films deposition processes in every type of LED can be performed simultaneously, the LED can be prepared at the same time without being separately prepared, thereby simplifying the processes of fabricating the multi-color light emitting pixel unit and the micro-LED display panel and facilitating large-scale production. As a result of the fabrication method according to the embodiments of the present disclosure, different types of LEDs are arranged side by side on a same substrate with a short distance between each other. Therefore, the size of the LEDs and the display panel made of the LEDs can be reduced. For example, the size of each LED can be 40 µm×40 µm. In addition, the tops of the different types of LEDs are not at the same horizontal plane. That is to say, the heights of the different types of LEDs are not the same, so as to expose the different types of light emitting layers on the top of different types of LEDs, thus ensuring the light emitting area and improving emission efficiency of every LED, and improving the integration of various LEDs. A micro-LED display panel formed by the pixel units of the embodiments of the present disclosure has a clear picture display and high resolution. Furthermore, since the electrical connector connects every metal layer in the Mth type of LED, the Mth type of light emitting layer, which is the top light emitting layer, in the Mth type of LED can emit light while the other light emitting layers in the Mth type of LED are short-circuited because the metal layers disposed on both sides of each one of the other light emitting layers are electrically connected to each other. For example, in the Mth type of LED, the first type of light emitting layer is short-circuited because the first type of metal layer and the second type of metal layer disposed on both sides of the first type of light emitting layer are electrically connected with each other; the second type of light emitting layer is short-circuited because the second type of metal layer and the third type of metal layer disposed on both sides of the second type of light emitting layer are electrically connected with each other; and so on. Therefore, various types of LEDs emit light separately without affecting each other. Furthermore, the micro-gap in the light emitting layer can release the stress in the interior of the light emitting layer and avoid warping thereof without influence on the light emitting efficiency of the light emitting layer, so as to improve the product yield.

While the invention has been particularly shown and described with references to preferred embodiments thereof, if will be understood by those skilled in the art that various changes in form and details may be made herein without departing from the spirit and scope of the invention as defined by the appended claims.

The invention claimed is:

1. A method for fabricating a multi-color light emitting pixel unit, comprising: forming a stack structure on a substrate, the stack structure comprising a first metal layer, a first type of light emitting layer, a second metal layer, and a second type of light emitting layer in an order from bottom to top; patterning the second type of light emitting layer and the second metal layer until a portion of a top surface of the first type of light emitting layer is exposed; and selectively etching the stack structure to expose a side surface of the first metal layer to form a first light emitting transistor and a second light emitting transistor, the first light emitting transistor including the first metal layer and the first type of light emitting layer, and the second light emitting transistor including the first metal layer, the first type of light emitting layer, the second metal layer, and the second type of light emitting layer.

2. The method of claim 1, wherein the forming the stack structure on the substrate comprises:
forming the first metal layer and the first type of light emitting layer on the substrate from bottom to top of the substrate;
forming a first metal bonding layer on top of the first type of light emitting layer;
forming the second type of light emitting layer and a second metal bonding layer on a first base from bottom to top of the first base;
bonding the first metal bonding layer and the second metal bonding layer to form the second metal layer; and
removing the first base.

3. The method of claim 2, wherein the forming the first metal layer and the first type of light emitting layer on the substrate from bottom to top of the substrate comprises:
forming a third metal bonding layer on the substrate;
forming the first type of light emitting layer and a fourth metal bonding layer on a second base from bottom to top of the first base;
bonding the third metal bonding layer and the fourth metal bonding layer to form the first metal layer; and
removing the second base.

4. The method of claim 2, further comprising:
before forming the first metal bonding layer on top of the first type of light emitting layer, thinning the first type of light emitting layer.

5. The method of claim 2, further comprising:
thinning the second type of light emitting layer.

6. The method of claim 2, further comprising:
forming micro-gap structures in at least one of the first type of light emitting layer or the second type of light emitting layer.

7. The method of claim 2, further comprising:
forming micro-gap structures in both of the first type of light emitting layer and the second type of light emitting layer,
wherein the micro-gap structures in the first type of light emitting layer are staggered relative to the micro-gap structures in the second type of light emitting layer.

8. The method of claim 1, further comprising:
electrically connecting the first metal layer and the second metal layer in the second light emitting transistor.

9. The method of claim 8, wherein the electrically connecting the first metal layer and the second metal layer in the second light emitting transistor comprises:
removing a portion of the second type of light emitting layer in the second light emitting transistor, so as to expose a top portion of the second metal layer in the second light emitting transistor; and
forming an electrical connector on the exposed top portion and a side wall of the second metal layer in the second light emitting transistor, and on side walls of the first type of light emitting layer and the first metal layer in the second light emitting transistor.

10. The method of claim 1, further comprising:
forming a top electrode layer on top of the first light emitting transistor and the second light emitting transistor.

11. The method of claim 10, wherein the forming the top electrode layer on top of the first light emitting transistor and the second light emitting transistor comprises: forming an isolation layer covering the first light emitting transistor and the second light emitting transistor; forming a first opening and a second opening in the isolation layer, the first opening exposing a portion of the first type of light emitting layer in the first light emitting transistor, and the second opening exposing a portion of the second type of light emitting layer in the second light emitting transistor; and forming the top electrode layer on the substrate, the top electrode layer contacting the first type of light emitting layer in the first light emitting transistor via the first opening and contacting the second type of light emitting layer in the second light emitting transistor via the second opening.

12. The method of claim 1, wherein the stack structure further comprises a third metal layer formed on top of the second type of light emitting layer, and a third type of light emitting layer formed on top of the third metal layer,
the method further comprising patterning the third type of light emitting layer and the third metal layer until a portion of the second type of light emitting layer is exposed, and
the selectively etching the stack structure further comprising selectively etching the stack structure to form the first light emitting transistor, the second light emitting transistor, and a third light emitting transistor, the third light emitting transistor including the first metal layer, the first type of light emitting layer, the second metal layer, the second type of light emitting layer, the third metal layer, and the third type of light emitting layer.

13. The method of claim 12, wherein the forming the stack structure on the substrate comprises:
forming the first metal layer, the first type of light emitting layer, the second metal layer, the second type of light emitting layer on the substrate from bottom to top;
forming a first metal bonding layer on the second type of light emitting layer;
forming the third type of light emitting layer and a second metal bonding layer on a base from bottom to top of the base;

bonding the first metal bonding layer and the second metal layer to form the third metal layer; and
removing the base.

14. The method of claim 12, further comprising:
thinning at least one of the first type of light emitting layer, the second type of light emitting layer, or the third type of light emitting layer.

15. The method of claim 12, further comprising:
forming micro-gap structures in at least one of the first type of light emitting layer, the second type of light emitting layer, or the third type of light emitting layer.

16. The method of claim 12, further comprising:
forming micro-gap structures in all of the first type of light emitting layer, the second type of light emitting layer, and the third type of light emitting layer,
wherein the micro-gap structures in the first type of light emitting layer are staggered relative to the micro-gap structures in the second type of light emitting layer, and
wherein the micro-gap structures in the second type of light emitting layer are staggered relative to the micro-gap structures in the third type of light emitting layer.

17. The method of claim 12, further comprising:
electrically connecting the first metal layer and the second metal layer in the second light emitting transistor, and electrically connecting the first metal layer, the second metal layer, and the third metal layer in the third light emitting transistor.

18. The method of claim 17, wherein the electrically connecting the first metal layer and the second metal layer in the second light emitting transistor, and electrically connecting the first metal layer, the second metal layer, and the third metal layer in the third light emitting transistor comprises:
   removing a portion of the second type of light emitting layer in the second light emitting transistor, so as to expose a top portion of the second metal layer in the second light emitting transistor;
   removing a portion of the third type of light emitting layer in the third light emitting transistor, so as to expose a top portion of the third metal layer in the third light emitting transistor;
   forming a first electrical connector on the exposed top and a side wall of the second metal layer in the second light emitting transistor, and on side walls of the first type of light emitting layer and the first metal layer in the second light emitting transistor; and
   forming a second electrical connector on the exposed top and a side wall of the third metal layer in the third light emitting transistor, and on side walls of the second type of light emitting layer, the second metal layer, the first type of light emitting layer, and the first metal layer in the third light emitting transistor.

19. The method of claim 12, further comprising:
forming a top electrode layer on top of the first light emitting transistor, the second light emitting transistor, and the third light emitting transistor.

20. The method of claim 19, wherein the forming a top electrode layer on top of the first light emitting transistor, the second light emitting transistor, and the third light emitting transistor comprises:
   forming an isolation layer covering the first light emitting transistor, the second light emitting transistor, and the third light emitting transistor;
   forming a first opening, a second opening, and a third opening in the isolation layer, the first opening exposing a portion of the first type of light emitting layer in the first light emitting transistor, the second opening exposing a portion of the second type of light emitting layer in the second light emitting transistor, and the third opening exposing a portion of the third type of light emitting layer in the third light emitting transistor; and
   forming the top electrode layer on the substrate, the top electrode layer contacting the first type of light emitting layer in the first light emitting transistor via the first opening, contacting the second type of light emitting layer in the second light emitting transistor via the second opening, and contacting the third type of light emitting layer in the third light emitting transistor via the third opening.

\* \* \* \* \*